US008367277B2

(12) United States Patent
Brehm et al.

(10) Patent No.: US 8,367,277 B2
(45) Date of Patent: Feb. 5, 2013

(54) METHOD FOR PRODUCING A MULTI-LAYER BODY, AND MULTI-LAYER BODY

(75) Inventors: Ludwig Brehm, Adelsdorf (DE); Rene Staub, Hagendorn (CH); Achim Hansen, Zug (CH); Mathias Seitz, Naumburg (DE); Heinrich Wild, Herzogenaurach (DE)

(73) Assignee: OVD Kinegram AG, Zug (CH)

( * ) Notice: Subject to any disclaimer, the term of this patent is extended or adjusted under 35 U.S.C. 154(b) by 570 days.

(21) Appl. No.: 12/310,035

(22) PCT Filed: Jul. 12, 2007

(86) PCT No.: PCT/EP2007/006196
§ 371 (c)(1), (2), (4) Date: Aug. 12, 2009

(87) PCT Pub. No.: WO2008/017362
PCT Pub. Date: Feb. 14, 2008

(65) Prior Publication Data

US 2009/0317595 A1 Dec. 24, 2009

(30) Foreign Application Priority Data

Aug. 9, 2006 (DE) ........................ 10 2006 037 431
Jan. 15, 2007 (DE) ........................ 10 2007 002 163

(51) Int. Cl.
*G03F 1/00* (2012.01)

(52) U.S. Cl. ........................................ 430/5; 430/322

(58) Field of Classification Search ........................ None
See application file for complete search history.

(56) References Cited

U.S. PATENT DOCUMENTS

| | | | | |
|---|---|---|---|---|
| 4,094,575 | A | 6/1978 | Kellie | |
| 4,353,952 | A | 10/1982 | Brown et al. | |
| 4,673,253 | A * | 6/1987 | Tanabe et al. | 349/106 |
| 4,971,894 | A | 11/1990 | Memis et al. | |
| 5,005,873 | A | 4/1991 | West | |
| 5,138,604 | A | 8/1992 | Umeda et al. | |
| 5,538,753 | A | 7/1996 | Antes et al. | |
| 5,538,757 | A | 7/1996 | Fitchmun et al. | |
| 6,328,342 | B1 | 12/2001 | Belousov et al. | |
| 7,425,894 | B2 | 9/2008 | Lutz et al. | |
| 2005/0068395 | A1 | 3/2005 | Haubold et al. | |
| 2005/0141094 | A1 * | 6/2005 | Wild et al. | 359/586 |
| 2006/0209412 | A1 | 9/2006 | Schilling et al. | |
| 2006/0251863 | A1 | 11/2006 | Katschorek et al. | |
| 2008/0050660 | A1 | 2/2008 | Staub et al. | |
| 2008/0310025 | A1 | 12/2008 | Staub et al. | |

FOREIGN PATENT DOCUMENTS

| | | |
|---|---|---|
| DE | 10318103 | 11/2004 |
| DE | 10318157 | 11/2004 |
| DE | 10328760 | 1/2005 |
| DE | 10333704 | 4/2005 |

(Continued)

*Primary Examiner* — Michael G Lee
*Assistant Examiner* — Matthew Mikels
(74) *Attorney, Agent, or Firm* — Hoffmann & Baron, LLP

(57) ABSTRACT

Described are various processes for the production of multi-layer bodies having at least one partially shaped functional layer and at least one further partially shaped layer and the multi-layer bodies produced in that way. The multi-layer body has at least one partially shaped functional layer in register relationship with at least one further partially shaped layer, which preferably supplement each other to provide a geometric, alphanumeric, pictorial, graphic or figurative colored representation.

54 Claims, 27 Drawing Sheets

FOREIGN PATENT DOCUMENTS

| | | |
|---|---|---|
| DE | 102005006231 | 8/2006 |
| DE | 102005006277 | 8/2006 |
| EP | 0382944 | 5/1995 |
| EP | 0537439 | 7/2003 |
| GB | 2136352 | 9/1984 |
| JP | 6079331 | 5/1985 |
| JP | 10100573 | 4/1998 |
| JP | 11058581 | 3/1999 |
| JP | 2008530600 | 8/2008 |
| JP | 2008530601 | 8/2008 |
| TW | 200604036 | 2/2006 |
| WO | WO0103945 | 1/2001 |
| WO | WO 03/052025 | 6/2003 |
| WO | WO 2006/084686 | 8/2006 |

* cited by examiner

METHOD FOR PRODUCING A MULTI-LAYER BODY, AND MULTI-LAYER BODY

This application claims priority based on an International Application filed under the Patent Cooperation Treaty, PCT/EP2007/006196, filed on Jul. 12, 2007 and German Application Nos. DE 102006037431.2-45, filed on Aug. 9, 2006, and DE 102007002163.3, filed on Jan. 15, 2007.

BACKGROUND OF THE INVENTION

The invention concerns a process for the production of a multi-layer body having at least one partially shaped functional layer in register relationship with at least one further partially shaped layer, and a multi-layer body which can be obtained in accordance therewith. The invention further concerns in particular a security element for security documents and value-bearing documents having such a multi-layer body.

Optical security elements are frequently used to make it difficult to copy and misuse documents or products and as far as possible to prevent such copying and misuse. Thus optical security elements are frequently employed for safeguarding documents, bank notes, credit cards, cash cards, identity cards and passes, packagings and the like. It is known in that respect to use optically variable elements which cannot be duplicated with conventional copying processes. It is also known to provide security elements with a structured metal layer in the form of a text, logo or other pattern.

The production of a structured metal layer from a metal layer which is applied over an area for example by sputtering requires a plurality of procedures, in particular if fine structures are to be produced, which have a high degree of forgery-proof nature. Thus it is known for example for a metal layer which is applied over the full surface area involved to be partially demetallized by positive/negative etching or by laser ablation, and thus to be structured. As an alternative thereto it is possible for metal layers to be already applied in structured form to a carrier by means of the use of vapor deposition masks.

The greater the number of production steps afforded for production of the security element, the correspondingly greater is the significance in terms of register accuracy of the individual process steps or the degree of accuracy of positioning of the individual tools when forming the security element in relation to features or structures already present on the security element.

GB 2 136 352 A describes a production process for the production of a sealing film provided with a hologram as a security feature. In that case a plastic film is metallized over its full surface area after the embossing of a diffractive relief structure and then demetallized in region-wise fashion in accurate register relationship with the embossed diffractive relief structure. The demetallization operation in accurate register relationship is costly and the degree of resolution which can be attained is limited by the adjustment tolerances and the procedure employed.

EP 0 537 439 B2 describes processes for the production of a security element with filigree patterns. The patterns are formed from diffractive structures covered with a metal layer and are surrounded by transparent regions in which the metal layer is removed. It is provided that the contour of the filigree pattern is introduced in the form of a recess into a metal-coated carrier material, in that case at the same time the bottom of the recesses is provided with the diffractive structures and then the recesses are filled with a protective lacquer. Excess protective lacquer is to be removed by means of a scraper blade. After application of the protective lacquer the metal layer is removed by etching in the unprotected regions.

SUMMARY OF THE INVENTION

The object of the present invention is to provide a multi-layer body which is particularly difficult to reproduce and a process for the production of such a multi-layer body, in which a partially shaped functional layer is shaped in perfect or almost perfect register relationship with a further partially shaped layer.

That object is attained for a first process for the production of a multi-layer body having at least one partially shaped functional layer in register relationship with at least one further partially shaped layer, in that a first relief structure is shaped in a first region of a replication layer of the multi-layer body, wherein a first layer is applied to the replication layer in the first region and in at least one second region in which the first relief structure is not shaped in the replication layer, and is structured defined by the first relief structure, in that the first layer is removed in the first region but not in the at least one second region or in the at least one second region but not in the first region, and wherein the at least one partially shaped functional layer is formed directly and/or using the structured first layer as a mask layer subsequently the at least one partially shaped functional layer is formed. The first layer is in that case applied in particular over the full surface area to the replication layer, but it may also involve an only region-wise application, for example in the form of stripes or the like.

Such a process makes it possible to produce particularly forgery-resistant multi-layer bodies.

The object is further attained by a first multi-layer body which can be obtained in accordance with the first process according to the invention, comprising at least one partially shaped functional layer in register relationship with at least one further partially shaped layer, wherein a first relief structure is shaped in a first region of a replication layer of the multi-layer body, wherein the at least one functional layer is applied to the replication layer in the first region or in at least one second region in which the first relief structure is not shaped in the replication layer structured definedly by the first relief structure.

Partially shaped functional layers or further layers which are produced by means of the invention can be achieved in a very high level of resolution. The attainable registration and resolution is better approximately by a factor of 100 than can be achieved by known processes. As the width of structure elements of the first relief structure can be in the region of the wavelength of visible light (between about 380 and 780 nm) but also therebelow, it is possible to form very fine contours, patterns or lines. Accordingly major advantages are also achieved in this respect over the processes used hitherto, and it is possible with the invention to produce security elements which have a significantly higher degree of safeguard against copying and forgery than hitherto.

Lines and/or pixels or picture elements can be produced with a high resolution, for example with a width or a diameter of less than 50 μm, in particular in the range of between 0.5 μm and 10 μm, but in the extreme case even down to about 200 nm. Preferably levels of resolution in the range of between about 0.5 μm and 5 μm, in particular in the region of about 1 μm, are produced. In comparison, line widths of less than 10 μm can be achieved only with a very high degree of complication and expenditure, when using processes which provide for adjustment of tools in terms of register relationship.

The object is attained for a second process for the production of a multi-layer body having at least one partially shaped functional layer in register relationship with at least one further partially shaped layer, in that a first layer in the form of a first photoresist lacquer layer is formed on a carrier layer and partially exposed, in particular by means of a belt mask exposure means or similar, the exposed first layer is developed and structured and then using the structured first layer as a mask layer the at least one partially shaped functional layer and/or the at least one further partially shaped layer is formed. Such a process also permits the production of particularly forgery-resistant multi-layer bodies.

The object is further attained by a second multi-layer body which can be obtained by the second process according to the invention, comprising at least one partially shaped functional layer in register relationship with at least one further partially shaped layer, wherein a first layer in the form of a first photoresist lacquer layer is produced structured in pattern form on a carrier layer and using the structured first layer as a mask layer the at least one partially shaped functional layer and/or the at least one further partially shaped layer is formed.

The term functional layer is used here to denote such a layer which either exhibits a visible color impression at given wavelengths or whose presence can be electrically, magnetically or chemically detected. For example this can involve a layer which contains coloring agents such as colored pigments or dyestuffs and which is colored, in particular multicolored, in normal daylight. It can however also be a layer which contains special coloring agents such as photochromic or thermochromic substances, luminescent substances, substances producing an optically variable effect such as interference pigments, liquid crystals, metameric pigments and so forth, reactive dyestuffs, indicator dyestuffs which react with other substances with a reversible or irreversible change in color, variable light-emission pigments which upon excitation by means of radiation of differing wavelength exhibit different color emissions, magnetic substances, electrically conductive substances, substances which present a color change in an electrical or magnetic field, what is referred to as E-ink® and the like.

The term replication layer is used generally to denote a layer which can be produced over a surface with a relief structure. It includes for example organic layers such as plastic or lacquer layers or inorganic layers such as inorganic plastic materials (for example silicone), glass layers, semiconductor layers, metal layers etc. but also combinations thereof.

A relief structure is embossed at the surface into a replication layer in the form of a plastic or lacquer layer, in particular formed from a lacquer which hardens under UV radiation, in particular by means of a tool, in particular a stamping punch or a roller. The formation of a surface relief structure by injection molding or the use of a photolithography process is also possible. A relief structure is formed in particular on the surface on a replication layer in the form of a glass, semiconductor or metal layer, by using a photolithography process in which a photosensitive layer is applied, exposed by way of a mask and developed. The regions of the photosensitive layer remaining on the replication layer are used as an etching mask and a relief structure is formed by etching in the replication layer. The photosensitive layer is then preferably removed. Depending on the respective production process used and the later purpose of use of the multi-layer body formed, transmissive or non-transmissive replication layers, in particular replication layers which are opaque or transparent to the human eye, can be used.

Preferably at least one second relief structure is produced in the at least one second region of the replication layer, the at least one second relief structure having a depth-to-width ratio h/d which is different in relation to the first relief structure. The second relief structure is formed in particular in a similar manner to the formation of the first relief structure. In addition at least two different second relief structures can be produced in the at least one second region.

It has proven desirable if the first relief structure is produced with a greater depth-to-width ratio than the at least one second relief structure and a transmission and in particular a transparency of the first layer in the first region is increased in relation to the transmission and in particular the transparency of the first layer in the at least one second region.

Preferably the first and/or the at least one second relief structure is in the form of a diffractive relief structure. In particular it is preferable for a diffractive relief structure with a depth-to-width ratio in respect of the individual structure elements of >0.3 to be produced in the first region as the first relief structure. A spatial frequency for the first relief structure is selected in particular in a region of >300 lines/mm, in particular in a region of >1000 lines/mm. It can further be provided that the product of spatial frequency and relief depth of the first relief structure is greater than the product of spatial frequency and relief depth of the second relief structure. That also makes it possible for the transmission of the first layer applied to the replication layer in the first region to be increased in relation to the layer applied in the second region, by virtue of the configuration of the relief structures in the replication layer in the first region and in the second region.

The first relief structure and/or the at least one second relief structure can be in the form of a light-diffracting and/or light-refracting and/or light-scattering and/or light-focusing micro- or nanostructure, in the form of an isotropic or anisotropic matt structure, a binary or continuous Fresnel lens, a microprism structure, a blaze grating, a macrostructure or a combination structure consisting thereof.

In addition it is also possible for the first relief structure and/or the at least one second relief structure to be a linear or crossed sine grating. The spatial frequency of the sine grating in that case is in the region of >300 lines/mm. In addition it is possible for the sine grating also to be based on a transformed line grid raster, for example oriented at a grid raster in wave form or in circular form. In the case of a crossed sine grating the difference in the azimuth angles is preferably 90° but can also include an angular range of between 5° and 85°. In this case sine grating means that the surface relief of the sine structure is of a sinusoidal form. Besides sinusoidal surface reliefs, relief structures with different kinds of surface relief shapes are also possible, for example binary (rectangular), triangular and so forth relief shapes.

The relief structures introduced into the replication layer can also be so selected that they can serve for orientation of liquid crystal (polymers). Thus the replication layer and/or the first layer can then be used as an orientation layer for liquid crystals. By way of example structures in groove form are introduced into such orientation layers, the liquid crystals being oriented at such structures before they are fixed in their orientation in that position by crosslinking or in some other fashion. It can be provided that the crosslinked liquid crystal layer forms the at least one further partially shaped layer.

The orientation layers can have regions in which the orientation direction of the structure constantly changes. If a region produced by means of such a diffractive structure is viewed through a polarizer with for example a rotating polarization direction, various clearly perceptible security features, for example motion effects, can be generated on the basis of the linearly changing polarization direction of the region. It can also be provided that the orientation layer has diffractive structures for orientation of the liquid crystals, which are locally differently oriented in such a way that the liquid crystals when considered under polarized light represent an item of information, such as for example a logo.

By virtue of the use of diffractive relief structures, with a suitable choice in respect of the thickness of the first layer, it is possible to generate very great differences, which can already be perceived with the eye, in the optical density of the first layer in the first region and in the second region. Surprisingly however it was found that such great differences in transmission in the first and second regions are not compellingly necessary for implementation of the process according to the invention. Structures with slight differences in the depth-to-width ratio, with a small layer thickness, usually have relatively minor differences in transmission. Even minor relative differences however can be boosted by increasing the thickness of the first layer and thus the mean optical density. Thus, good results can already be achieved with quite slight differences in transmission in respect of the first layer in the first and second regions.

The dimensionless depth-to-width ratio is a characterizing feature in regard to the enlargement of the surface area, preferably of periodic structures, for example of a sine-square configuration. Here the spacing between the highest and the lowest successive points of such a structure is referred to as the depth, that is to say this involves the spacing between a "peak" and a "trough". The spacing between two adjacent highest points, that is to say between two "peaks", is referred to as the width. Now, the higher the depth-to-width ratio, the correspondingly steeper are the "peak flanks" and the correspondingly thinner is the first layer deposited on the "peak flanks". The effect of producing a higher level of transmission, in particular transparency, upon an increase in the depth-to-width ratio is also observed in relation to structures with vertical flanks, for example rectangular gratings. This however can also involve structures to which this model cannot be applied. By way of example, this can involve discretely distributed line-shaped regions which are only in the form of a "trough", wherein the spacing between two "troughs" is a multiple greater than the depth of the "troughs". Upon formal application of the above-indicated definition the depth-to-width ratio calculated in that way would be approximately zero and would not reflect the characteristic physical behavior. Therefore in the case of discretely arranged structures which are formed substantially only from a "trough", the depth of the "trough" is to be related to the width of the "trough".

As was shown it is not important in that respect that the first layer is of a transparent nature in regions with a high depth-to-width ratio. This can involve structures which for example form optically active regions of a hologram or Kinegram® security feature. The only important consideration is that those regions are delimited in relation to other regions by their transmission properties or a lesser or a greater optical density.

The first and second relief structures involve different relief structures, for example a Kinegram®, in which one or more relief parameters, for example orientation, fineness or profile shape vary to produce the desired diffractive properties. Thus the task of such structures is not only to achieve a change in the transmission properties of the first layer in the region in which the relief structure is shaped into the replication layer, but additionally also the function of acting as an optically variable design element upon being backed with a reflection layer or an optical separation layer. If, besides such a first relief structure, such a second relief structure is also shaped in the replication lacquer layer, then the first and second relief structures preferably differ in one or more parameters relevant to the transmission properties of the first layer, and thus differ for example in relief depth or in the depth-to-width ratio. Thus it is possible for example for two Kinegrams® security features with filigree line patterns to be shaped in partially overlapping relationship in the replication layer. The first Kinegram® forms the first relief structure and the second Kinegram® forms the second relief structure. The relief structures of the two designs differ in the typical depth-to-width ratio while the other structural parameters are similar. There are thus three "groups" of structures, namely structures of group I in the first Kinegram®, structures of group II in the second Kinegram® and structures of group III or no structures in the background. In a first step the first layer remains, for example a vapor-deposited metal layer such as a copper layer, in the Kinegram® region of the first design, the remainder is removed. Then for example a colored functional layer is applied over the entire surface area and removed by suitable process implementation in the background regions. Two designs in register relationship are obtained in that way.

Experiments have shown that the differences in the transmission properties of the first layer, which can be achieved by the differing configuration of the relief structures in the first and second regions, are particularly pronounced in the range of UV radiation. Thus particularly good results can be achieved when using UV radiation for the exposure procedure.

The first layer can be a very thin layer of the order of magnitude of some nm. The first layer is considerably thinner in regions with a high depth-to-width ratio, by virtue of the greater surface area, than in regions with a lower depth-to-width ratio, upon deposition of the first layer with a constant density in relation to surface area, with respect to the plane defined by the replication layer. It is advantageously provided that the first layer is in the form of a metal layer or a layer of a metal alloy. Such layers can be applied with tried-and-tested processes such as sputtering and they already afford adequate optical density at small layer thicknesses. The first layer however can also be a layer including a functional layer material or a non-metallic layer which for example can be colored, in particular brightly colored, which can be doped or which can be mixed with nanoparticles or nanospheres to increase the optical density thereof. It has further proven desirable for the first layer to be formed from a substance containing a liquid crystal material.

For the first process it has been found desirable if the first layer is applied with a constant density in relation to surface area to a plane defined by the replication layer and the first layer is exposed to an etching agent, in particular an acid or lye in an etching process both in the first region and also in the at least one second region until the first layer is removed in the first region or at least until the transmission and in particular transparency of the first layer is increased in the first region in relation to the transmission and in particular transparency of the first layer in the at least one second region, or vice-versa.

For example lyes or acids can be provided as the etching agent for first layer. It can further be provided that the first layer is only partially removed and the etching operation is interrupted as soon as a predetermined transparency is achieved. In that way it is possible for example to produce security features based on locally differing transparency. If for example aluminum is used as the first layer it is thus possible to use lyes such as NaOH or KOH as isotropically acting etching agents. It is also possible to use acid media such as PAN (a mixture of phosphoric acid, nitric acid and water).

The reaction speed typically increases with the concentration of the lye and temperature. The choice of the process parameters depends on the reproducibility of the process and the resistance of the multi-layer body. Influencing factors when etching with lye are typically the composition of the etching bath, in particular the concentration of etching agent, the temperature of the etching bath and the afflux flow conditions of the layer to be etched in the etching bath. Typical parameter ranges in the concentration of the etching agent in the etching bath are in the range of between 0.1% and 10% and for the temperature they are in the range of between 20° C. and 80° C.

The etching operation for the first layer can be electrochemically supported. The etching procedure is boosted by application of an electrical voltage. The action is typically isotropic so that the structure-dependent enlargement in surface area additionally amplifies the etching effect. Typical electrochemical additives such as wetting agents, buffer substances, inhibitors, activators, catalysts and the like for example to remove oxide layers can support the etching process.

During the etching process a depletion in etching medium or an enrichment in the etching products respectively can occur in the interface layer with the first layer, whereby the etching speed is reduced. Forced thorough mixing of the etching medium, possibly by producing a suitable flow or by ultrasonic excitation, improves the etching characteristics.

The etching process can further involve a temperature profile in respect of time in order to optimize the etching result. Thus it is possible to etch cold at the beginning and hotter with an increasing period of operation. In the etching bath that is preferably implemented by a three-dimensional temperature gradient, wherein the multi-layer body is drawn through an elongate etching bath with different temperature zones.

The last nanometers of the first layer can prove in the etching process to be relatively stubborn and resistant to the etching procedure. To remove residues of the first layer slight mechanical support for the etching process is therefore advantageous. The stubbornness is based on a possibly slightly different composition in the first layer, presumably by virtue of interface layer phenomena in the formation of the first layer on the replication layer. In that case the last nanometers of the first layer are preferably removed by means of a wiping process by the multi-layer body being passed over a roller covered with a fine cloth. The cloth wipes off the residues of the first layer without damaging the multi-layer body.

The etching operation does not have to involve a production step which is carried out with liquids. It may also be a "dry process" such as for example plasma etching.

It can however also be provided that the first layer is not completely partially removed, but only its thickness is reduced. Such an embodiment can be particularly advantageous if regions with layers which overlie each other are to be formed for example to vary optical and/or electrical properties or to produce decorative effects.

It has further proven to be desirable for the first process if the first layer is applied with a constant density in relation to surface area with respect to a plane defined by the replication layer and if the first layer is used as an absorption layer for partial removal of the first layer itself by the first layer being exposed to a laser light both in the first region and also in the second region.

In the case of structures with a high depth-to-width ratio and in particular relief structures in which the typical spacing between two adjacent raised portions is less than the wavelength of the incident light, referred to as zero order structures, a large part of the incident light can be absorbed, even if the degree of reflection of a reflection layer is high in a region having a mirror reflection effect. A first layer in the form of a reflection layer is irradiated by means of a focused laser beam, in which case the laser radiation is absorbed to an increased extent and the reflection layer correspondingly increased in temperature in the greatly absorbing regions which have the above-mentioned relief structures with a high depth-to-width ratio. With high levels of energy input the reflection layer can locally flake off, in which case removal or ablation of the first layer in the form of a reflection layer or coagulation of the material of the reflection layer or the first layer occurs. If energy input by the laser takes place only for a short time and if the effect of heat conduction is thus only slight, then ablation or coagulation occurs only in the regions predefined by the relief structure.

Influencing factors in laser ablation are the configuration of the relief structure (period, depth, orientation and profile), wavelength, polarization and the angle of incidence of the incident laser radiation, the duration of the action (time-dependent power) and the local dose of laser radiation, the properties and the absorption characteristics of the first layer, and whether the first layer is possibly overlaid and underlaid with further layers such as the structured photosensitive layer or a wash lacquer layer.

Inter alia Nd:YAG lasers have proven to be suitable for the laser treatment. They radiate at about 1064 nm and are preferably also pulse-operated. It is also possible to use diode lasers. The wavelength of the laser radiation can be altered by means of a frequency charge, for example frequency doubling.

The laser beam is passed over the multi-layer body by means of what is referred to as a scanning device, for example by means of galvanometric mirrors and a focusing lens. Pulses of a duration in the region of nano- to microseconds are emitted during the scanning operation and lead to the above-described ablation or coagulation of the first layer, which is predetermined by the structure. The pulse durations are typically below milliseconds, advantageously in the region of a few microseconds or therebelow. It is certainly also possible to use pulse durations of between nanoseconds and femtoseconds. Precise positioning of the laser beam is not necessary as the process is self-referencing insofar as the photosensitive layer or wash lacquer layer which is present in structured form partially prevents access of the laser radiation to the first layer. The process is preferably further optimized by suitable selection of the laser beam profile and the overlapping of adjoining pulses.

It is however also possible for the path of the laser over the multi-layer body to be controlled in register relationship with the relief structures arranged in the replication layer or openings in the photosensitive layer or wash lacquer layer so that only regions with the same relief structure or with/without openings in the photosensitive layer or wash lacquer layer are irradiated. For example camera systems can be used for such a control.

Instead of a laser focused onto a point or a line, it is also possible to use areal radiating devices which emit a short controlled pulse such as for example flash lamps.

The advantages of the laser ablation process include inter alia that partial removal of the first layer, in register relationship with a relief structure, can also be effected if it is covered on both sides with one or more further layers which are transparent for the laser radiation, and is thus not directly accessible to the etching media. The first layer is only broken open by the laser. The material of the first layer is deposited again in the form of small conglomerates or small balls which are not optically visible to the viewing person and only immaterially influence the transparency in the irradiated region.

Residues which have still remained on the replication layer after the laser treatment, from the first layer in the first region, can optionally be removed by means of a subsequent washing or etching process if the first layer is directly accessible there. After etching of the first layer the remaining residues of the etching masks can be removed.

For the first process it is particularly preferred if the first layer is applied with a constant density in relation to surface area with respect to a plane defined by the replication layer and the first layer is already formed with a layer thickness such that transmission and in particular transparency of the first layer in the first region is increased in relation to transmission and in particular transparency of the first layer in the at least one second region, or vice-versa.

It is particularly preferred for the first process if the first layer is applied with a constant density in relation to surface area in relation to a plane defined by the replication layer and a first photosensitive lacquer layer is applied to the first layer or the replication layer is formed by a first photosensitive wash lacquer layer, wherein the first photosensitive lacquer layer or the first wash lacquer layer is exposed through the first layer so that the first photosensitive lacquer layer or the first wash lacquer layer is exposed differently governed by the first relief structure in the first and the at least one second region, wherein structuring of the exposed first photosensitive lacquer layer or the first wash lacquer layer is effected, and either simultaneously or subsequently, using the structured first photosensitive lacquer layer or wash lacquer layer as a first mask layer, the first layer is removed and thus structured in the first region but not in the at least one second region or in the at least one second region but not in the first region.

The process can moreover be such that a photosensitive material having a binary characteristic is applied as the photosensitive layer or the photosensitive wash lacquer layer and the photosensitive layer or the photosensitive wash lacquer layer are exposed through the first layer with an exposure strength and exposure time, that the photosensitive layer or the photosensitive wash lacquer layer is activated in first region in which the transmission of the first layer is increased by the first relief structure and is not activated in the second region. The process according to the invention can also be applied if the optical densities of the first and second regions differ only little from each other, in which case, as already mentioned above, it is surprisingly possible to assume that there is a high to medium optical density.

The photosensitive layer or wash lacquer layer can be a photoresist which can be in the form of a positive or a negative photoresist. In that way, with the replication layer being otherwise of the same nature, it is possible to remove different regions of the first layer.

It can further be provided that the photosensitive layer is in the form of a photopolymer.

Depending on whether the photosensitive layer or wash lacquer layer is a positive or negative photoresist, it is hardened in the first regions or made soluble in a developer. In that respect positive and negative photoresist layers can also be applied in mutually juxtaposed relationship and exposed at the same time. In that case the first layer serves as a mask and is preferably arranged in direct contact with the photoresist so that precise exposure can be effected. Upon development of the photoresist finally the non-hardened regions are washed off or the damaged regions removed. Depending on the photoresist used the developed photoresist is now either present precisely in the regions in which the first layer is transparent to the UV radiation or non-transparent. To increase the resistance of the photoresist layer which has remained and which is structured in accordance with the first layer remaining regions are preferably subsequently hardened, after the development procedure.

The first layer is used in particular as a mask layer for partial removal of the first layer itself, insofar as the photosensitive layer or wash lacquer layer adjoining the first layer is exposed through the first layer. That achieves the advantage over the mask layers applied with conventional processes that the mask layer is oriented in accurate register relationship without the complication and expenditure involved in adjustment. Only the tolerances of the relief structure have an influence on the tolerances of the position of the differently transmissive regions of the first layer. Lateral displacement between the first relief structure and those regions of the first layer does not occur. The arrangement of regions of the first layer with identical physical properties is therefore exactly in register relationship with the first relief structure.

In regard to the mode of operation when using a photosensitive layer it is further possible if a photoactivatable layer is applied as the photosensitive layer to the first layer, the photoactivatable layer is exposed through the first layer and the replication layer and activated in the first region, and the activated regions of the photoactivatable layer form an etching means for the first layer so that the first layer is removed in the first region and thus structured.

The photosensitive layer or wash lacquer layer can further be partially removed if the exposed regions are structurally weakened so that to remove the exposed regions, a scraping-off, brushing-off, wiping-off, ultrasound or laser treatment or the like can be effected. If exposure of the photosensitive layer or wash lacquer layer results in partially increased brittleness of the layer, the replication layer, insofar as it is flexible or bendable, can be drawn over a sharp edge or knife edge and the brittle regions can be caused to flake off.

An advantageous configuration provides that the photosensitive layer or wash lacquer layer is exposed through the first layer by means of UV radiation.

Accordingly the first layer can be structured or partially removed by means of different processes immediately or after the implementation of further process steps. In that respect the at least one partially shaped functional layer is formed immediately and/or subsequently, using the structured first layer as a mask layer, the at least one partially shaped functional layer is formed.

In regard to the first process and the first multi-layer body the invention is based on the one hand on the realization that, governed by the first relief structure in the first region of the replication layer, physical properties of the first layer applied to the replication layer in that region, for example effective thickness or optical density, are influenced, so that the transmission properties of the first layer differ in the first and second regions. The first layer is applied to the replication layer preferably by means of sputtering, vapor deposition, by being powdered on or by being sprayed on. Due to the procedure involved the sputtering operation entails directed application of material so that, in an operation of sputtering on material of the first layer in a constant density in relation to surface area with respect to the plane defined by the replication layer, the material is deposited in locally differing thicknesses on the replication layer provided with the relief structure. In terms of process technology, vapor deposition of the first layer or powdering it on or spraying it on preferably also involves the production of an at least partially directed application of material.

When carrying out the first process the first layer preferably directly produces the partially shaped functional layer. Furthermore it is also advantageous if the structured first photosensitive layer or first wash lacquer layer directly forms the partially shaped functional layer.

Finally, it has proven desirable for the first process if the at least one partially shaped functional layer and/or the further partially shaped layer is formed by a procedure whereby subsequently a first positive or negative photoresist lacquer layer is applied, the first photoresist lacquer layer is exposed through the structured first layer and structuring of the exposed first photoresist lacquer layer is effected.

It is preferable if a respective partially shaped functional layer is formed in register relationship with the first relief structure and at least one second relief structure, in which case different photoresist lacquer layers, in particular differently colored photoresist lacquer layers are used for forming the partially shaped functional layer. It is possible to use photoresist lacquer layers involving markedly different properties such as for example spectral sensitivity, chemical composition, positive or negative characteristic and so forth. However use of similar photoresist lacquer layers which however are exposed in different ways is also possible. The difference in the two photoresist lacquer layers can be effected in particular by way of the properties involved in the exposure operation such as wavelength, angle of incidence, polarization and so forth.

By means of the nature of the first relief structure, possibly also that of the first layer or further layers, an adhesion property and/or diffusion resistance and/or surface reactivity of the replication layer or further layers is possibly locally influenced so that a material for forming the first layer or further layers adheres to, diffuses into or reacts with the replication layer or further layers, in locally different ways. When material diffuses into the replication layer a part of the replication layer inclusive of the material diffused therein becomes the first layer.

As an alternative thereto the replication layer is partially produced by diffusion of a coloring means itself thereinto, in part in the form of a partially shaped functional layer, in which case a further layer partially shaped on the replication layer, for example a structured photosensitive, metallic or organic dielectric layer, functions locally as a diffusion barrier. The photosensitive layer can be removed after partial coloring of the replication layer or prior to the application of a further layer.

It has further proven desirable for the first process if the first layer is formed by the application of a powder or a liquid medium, then the first layer is structured, possibly after physical or chemical treatment of the powder or the liquid medium, and either directly the at least one partially shaped functional layer is formed and/or, using the structured first layer as a masking layer, the at least one partially shaped functional layer is then formed.

The powder is applied in particular by dusting or spreading while the liquid medium is applied in particular by casting, printing or spraying. Mechanical incorporation into the relief structure can be subsequently effected, for example by shaking, brushing or similar. Partial removal of the first layer is then effected in the regions in which the adhesion is less or the diffusion resistance is increased, by mechanically pulling it off, in particular by means of a stripping rake, an air rake or a stripping blade, chemical dissolution, a washing process or a combination of those procedures. Structuring of the first layer is preferably effected by a stripping blade or stripping rake which is moved over the replication layer, wherein the regions of the first layer which have not penetrated into recesses of the relief structure are removed. Subsequently a time-controlled etching process can follow, for removal of residues of the first layer in flat regions or of color fogs. The etching process can also be locally used to influence the thickness of the first layer within the relief structure, to set different levels of color saturation or to adjust the iridescence of a first layer with a viewing angle-dependent interference effect.

However a washing process can also be suitable for structuring of the first layer, in particular if the capillary forces within the relief structure are sufficient to fix the material, which is therein, of the first layer in the washing procedure. Here in particular relief structures which have macroscopic recesses and in addition in the recesses a microstructure can be advantageous.

In a further preferred embodiment the relief structure is formed with at least two trenches of different depths or is provided on the bottom of at least two trenches of different depths, wherein the trenches are each in particular of a depth in the range of between 1 and 10 μm and a width in the range of between 5 and 100 μm. If the trenches are filled for example with colored photoresist and the replication layer is freed of the photoresist in the regions without trenches different color saturation levels occur in dependence on the trench depth and possibly further optical effects.

In this case also it is further possible that the configuration of the first relief structure, possibly also the configuration of the first layer or further layers, locally influence an adhesion property and/or a diffusion resistance and/or a surface reactivity of the replication layer or further layers so that the powder or the liquid medium adheres in locally differing fashion to the replication layer or further layers, diffuses thereinto or reacts therewith.

Subsequently in a preferred embodiment the at least one partially shaped functional layer or the at least one further partially shaped layer is formed by a procedure whereby a first positive or negative photoresist lacquer layer is applied, the first photoresist lacquer layer is exposed through the structured first layer and structuring of the exposed first photoresist lacquer layer is effected.

Furthermore optionally the replication layer is also formed partially by diffusion thereinto of a coloring agent in the form of a partially shaped functional layer, in which case the replication layer itself or a layer partially shaped thereon locally functions as a diffusion barrier.

In regard to the first process the replication layer is at least partially flat in particular in the at least one second region. That facilitates for example pulling off the surface with a stripping rake or stripping blade as the flat region serves in optimum fashion as a support therefor. In addition the flat regions can be backed with a metallic reflection layer so that optically the effect of mirror surfaces is produced.

Finally, for the first process, for the formation of relatively thick partially shaped layers, it has proven desirable if a material is raked into exposed regions of the replication layer with the first relief structure or the at least one second relief structure which, viewed perpendicularly to the plane of the replication layer, are surrounded by a partially shaped functional layer or further layer, and at least one further partially shaped functional layer or further partially shaped layer is formed.

For the second process it has proven desirable if the at least one partially shaped functional layer or the at least one further partially shaped layer is formed by a procedure whereby a second positive or negative photoresist lacquer layer mixed with coloring agent is applied, the second photoresist lacquer layer is exposed through the structured first layer and structuring of the exposed second photoresist lacquer layer is effected. In that respect it is preferable if the first or the second photoresist lacquer layer forms the at least one partially shaped functional layer. Subsequently optionally the carrier layer is formed partially by diffusion of a coloring agent, in the form of a partially shaped functional layer or further layer, wherein at least the first and/or second structured photoresist lacquer layer functions as a diffusion barrier.

Optionally a material is raked into exposed regions of the carrier layer, which viewed perpendicularly to the plane of the carrier layer are surrounded by a partially shaped functional layer or further partially shaped layer, and at least one further partially shaped functional layer or further partially shaped layer is formed.

The configuration of the photoresist layers, optionally also the configuration of further layers, possibly also locally influences an adhesion property and/or a diffusion resistance and/or a surface reactivity of the carrier layer or further layers so that a material for forming a partially shaped functional layer or further layers adheres to the carrier layer or further layers in locally differing fashion, diffuses thereinto or reacts therewith. In the operation of diffusing material into the carrier layer a part of the carrier layer inclusive of the material diffused therein becomes a partially shaped functional layer or further partially shaped layer.

Furthermore it has proven desirable if polyester is used as the replication layer or carrier layer and a metal layer is used as the first layer, and the regions which have remained in that way are exposed to an electrostatic field and the powder is selectively deposited in the regions which have remained, due to the different field characteristics, similarly to a toner. Thermal consolidation of the powder is then effected to form a closed, firmly adhering, partially shaped functional layer or further layer.

The first layer is therefore generally a layer which can perform a dual function. On the one hand it can implement the function of a high-precision exposure mask for the production procedure for the partially shaped functional layer and/or further layers, while on the other hand at the end of the production procedure it possibly itself forms a partially shaped layer which is highly accurately positioned, for example the partially shaped functional layer or further layer, possibly in the form of an OVD layer, a conductor track or a functional layer of an electrical component, for example an organic semiconductor component, a decorative layer such as a bright multicolored layer or the like.

It is preferable if the at least one partially shaped functional layer is in the form of a lacquer layer or a polymer layer. The above-mentioned preferred functional layer materials such as pigments or dyestuff can be particularly easily integrated into such a layer.

In particular the at least one partially shaped functional layer is produced with the addition of one or more, in particular non-metallic functional layer materials.

It is particularly advantageous in regard to the decorative effect of the partially shaped functional layer if the at least one partially shaped functional layer is produced with the addition of one or more colored, in particular brightly multicolored functional layer materials.

The at least one further partially shaped layer is formed in particular by the first layer and/or at least one colored positive or negative photoresist lacquer layer and/or by at least one optically variable layer with an optical effect which differs in dependence on the viewing angle and/or by at least one metallic reflection layer and/or by at least one dielectric reflection layer. It can be provided that the dielectric is for example of $TiO_2$ or ZnS. The at least one partially shaped functional layer and the at least one further partially shaped layer can be formed with different refractive indices so that optical effects can be afforded thereby.

The first layer and/or the second layer can also be a polymer so that for example the one layer can be in the form of an electrical conductor and the other layer can be in the form of an electrical insulator, in which case both layers can be in the form of transparent layers.

The optically variable layer is preferably such that it includes at least one substance with an optical effect which differs in dependence on the viewing angle and/or is formed by at least one liquid crystal layer with an optical effect which differs in dependence on the viewing angle and/or by a thin film reflection layer stack with an interference color effect which is dependent on the viewing angle.

Furthermore it has proven desirable if the structured first layer is at least partially removed and replaced by the at least one partially shaped functional layer and/or the at least one further partially shaped layer. It is also possible to effect complete removal of the structured first layer.

Equally a hydrophilic or hydrophobic medium with functional components (for example dyestuffs, pigments) can be partially deposited over a hydrophobic or hydrophilic deposit layer which is partially shaped by the process, in a following step by way for example of printing, dipping or spray processes.

In an advantageous configuration a first further partially shaped layer can be introduced into the regions in which the first layer has been removed. It can further be provided that the residues of the first layer are replaced after complete removal by a second further partially shaped layer. The multilayer body can now only have a high-resolution “color print” of photoresist, for the viewing person, but otherwise can be transparent. In that case the photoresist functions as an etching mask for the first layer.

The process according to the invention is therefore not restricted to the partial removal of a layer but it can involve further process steps which provide for the exchange of layers or the repetition of process steps when using differences in optical density for forming or differentiating regions.

Advantageously it is possible in that way to form high-resolution display elements. Without departing from the scope of the invention it is possible for display elements of differing colors to be applied in accurate register relationship and for them to be arranged for example in a pixel grid raster. As different multi-layer bodies can be produced with an initial layout for the first layer, by a procedure whereby for example different exposure and etching processes are combined together or carried out in succession, positioning in accurate register relationship of the successively applied layers is possible when using the process according to the invention, in spite of increasing the process steps.

It can further be provided that the first layer and/or the at least one partially shaped functional layer and/or the at least one further partially shaped layer are galvanically reinforced if this involves electrically conductive layers or layers which are suitable for current-less galvanization.

It is preferred if the at least one partially shaped functional layer, viewed perpendicularly to the plane of the replication layer or carrier layer, is arranged in coincident relationship above or beneath the at least one further partially shaped layer.

Alternatively thereto however it is equally desirable if the at least one partially shaped functional layer, viewed perpendicularly to the plane of the replication layer or carrier layer, is arranged alternately or with a uniform spacing relative to at least one further partially shaped layer.

Particularly attractive optical effects can be achieved if at least one first transparent spacer layer is arranged between the at least one partially shaped functional layer and the at least one further partially shaped layer. As an alternative thereto or in combination therewith, at least one second transparent spacer layer is disposed between at least two further partially shaped layers. In that way different color effects and/or patterns can be visible at different viewing angles or a three-dimensional impression or optical depth can be achieved. The effect can also be reinforced if the first and/or the second spacer layer is formed locally in at least two different layer thicknesses. In combination therewith the at least one partially shaped functional layer and the at least one further partially shaped layer can each be of a line-shaped configuration, in which case in particular a continuously varying line width can afford an additional optical effect.

It has been found desirable if the first and/or the second spacer layers are formed locally with a layer thickness in the region of <100 μm, in particular in the range of between 2 and 50 μm.

It is particularly preferred if the at least one partially shaped functional layer and the at least one further partially shaped layer are of such a configuration that at least one optical superpositioning effect which is possibly viewing angle-dependent, in particular a moiré effect or shadowing effect, occurs.

The first layer is preferably applied over the full surface area to the replication layer or the carrier layer in a thickness at which the first layer is opaque to the human eye, and in particular involves an optical density of greater than 1.5, in particular an optical density in the range of between 2 and 7. More specifically it has surprisingly been found that the ratio of the transmissivities of the regions with a diffractive relief structure can be increased by the increase in opacity of the first layer. If thus exposure is effected with a suitable illumination strength through a layer usually referred as opaque (for example optical density of 5), which by virtue of its high optical density would normally not be used as a mask layer, particularly good results can be achieved.

A particularly preferred embodiment is one in which the at least one partially shaped functional layer and the at least one further partially shaped layer are such that, viewed perpendicularly to the plane of the replication layer or carrier layer, they supplement each other to afford a decorative and/or informative geometric, alphanumeric, pictorial, graphic or figurative representation.

In that respect an embodiment which has proven to be particularly forgery-proof is one in which the at least one partially shaped functional layer and the at least one further partially shaped layer are each at least region-wise of a line-shaped configuration, wherein the lines blend into each other without displacement, and in particular also blend into each other with a continuous color configuration, for example a rainbow configuration. The different lines can alternatively or additionally also be arranged in mutually juxtaposed relationship and form a concentric circular line pattern.

Particularly fine lines have proven to be advantageous in that respect, in particular if the lines, viewed perpendicularly to the plane of the replication layer or carrier layer, are produced with a width in the region of <50 μm, in particular in the range of between 0.5 and 10 μm.

For a multi-layer body produced in accordance with the described process however it can also be provided that the second region comprises two or more subregions enclosed by the first region, a diffractive second relief structure is shaped in the replication layer in the second region and the first layer is a reflection layer which is removed in the first region and is thus arranged in accurate register relationship with the second relief structure. Such multi-layer bodies can advantageously be provided as forgery-proof security elements. They are already particularly forgery-proof for the reason that particularly fine line widths can be produced with the process according to the invention. In addition, because of their diffractive structure and their orientation in accurate register relationship with the reflection layer, those fine lines can produce optical effects which can only be imitated with extreme difficulty.

It can further be provided that the first region comprises two or more subregions enclosed by the second region or vice-versa and the first layer is a reflection layer which is removed in the second region and is thus arranged in precise register relationship with the first relief structure. Advantageous configurations that the subregions of the second region or the subregions of the first region respectively are of a width of less than 2 mm, preferably less than 1 mm.

The at least one partially shaped functional layer is preferably colored with at least one opaque and/or at least one transparent coloring agent which at least in the wavelength range of the electromagnetic spectrum is colored or color-producing and in particular is brightly multicolored or brightly color-producing. In particular it has proven desirable if a coloring agent is included in the at least one partially shaped functional layer, which can be excited outside the visible spectrum, for example under UV or IR radiation, and produces a visually recognizable colored impression. It is thus possible that at least one partially shaped functional layer is provided with at least one dyestuff or pigment which is radiation-excitable and which fluoresces red, green and/or blue, and thereby produces an additive color upon being irradiated.

The at least one coloring agent is preferably selected from the group of inorganic or organic coloring agents, in particular pigments or dyestuffs.

Inter alia coloring agents are particularly preferred, which luminesce and in particular fluoresce upon being irradiated or excited with ultraviolet radiation in the visible wavelength range. In that respect it is possible to use luminescing pigments, dyestuffs or copolymers which without excitation are colored or colorless in the visible wavelength range. It is further possible to use a mixture comprising at least two or more luminescent coloring agents of the same or different kinds.

Pigments can be in the form of nanopigments of a size of between 1 and 100 nm. Particularly preferred in that respect are fluorescent nanopigments which are colorless in the visible wavelength range and which fluoresce under UV radiation, in particular at 254 nm, 313 nm or 365 nm. Nanopigments can be dispersed by simple stirring in printing media and can be easily processed in printing inks in inkjet printing processes while conventional pigments have to be ground with the printing medium in a complicated and expensive procedure in order to achieve a useable dispersion. In regard to nanoparticles and the use thereof attention is also directed to WO 03/052025 A1.

The use of a luminescent coloring agent or a combination of at least two luminescent coloring agents which upon excitation with different wavelengths produce different visible colored emissions is particularly preferred. In that respect at least one luminescence appearance can occur in the infrared and/or visible and/or ultraviolet range. Thus for example a single coloring agent, upon UV excitation with a wavelength of 365 nm, can emit a different colored fluorescence manifestation in the visible range, than is emitted upon UV excitation with a wavelength of 254 nm in the visible range. Such a bifluorescent pigment which visibly fluoresces red with an excitation at 254 nm and visibly fluoresces blue-white upon excitation at 365 nm can be obtained for example under the designation BF11 from Specimen Document Security Division, Budapest. Examples relating to monoluminescent coloring agents which exhibit visible emissions of different colors upon excitation and which can be used in combination are also to be found in U.S. Pat. No. 5,005,873.

A combination of luminescent coloring agents which are colorless at visible wavelengths and which luminesce in color under UV radiation in the visible range in such a way that a true-color image is generated is particularly preferred.

Organic luminescent coloring agents which are excitable by means of UV irradiation can be obtained for example under the designation UVITEX® which for example fluoresce in the UV range and in the visible range.

Inorganic, excitable luminescent coloring agents can be obtained among other materials such as $La_2O_2S$:Eu, $ZnSiO_4$:Mn or $YVO_4$:Nd and for example under the designation LUMILUX®.

Luminescent copolymers are for example co-polyamides, co-polyesters or co-polyesteramides which have mixed-in fluorescent components.

Luminescent coloring agents and mixtures thereof can in that respect be used alone or in combination with conventional non-luminescent coloring agents.

A particularly attractive configuration is a configuration involving the at least one partially shaped functional layer and the at least one further partially shaped layer in complementary colors as in the colors red and green, at least when viewed at a given viewing angle or under a given kind of radiation.

Particularly striking and attractive effects are achieved for the first multi-layer body if the at least one partially shaped functional layer and/or the at least one further partially shaped layer is backed with a diffractive relief structure and exhibits a holographic or kinegraphic optically variable effect.

A preferred first embodiment of the multi-layer body is formed if the at least one partially shaped functional layer is an in particular opaque metal layer and the at least one further partially shaped layer is a colored lacquer layer or vice-versa.

A preferred second embodiment of the multi-layer body is formed if the at least one partially shaped functional layer is a layer containing liquid crystals and the at least one further partially shaped layer is a colored lacquer layer or vice-versa.

A preferred third embodiment of the multi-layer body is formed if the at least one partially shaped functional layer is formed by a thin film reflection layer stack with viewing angle-dependent interference color effect and the at least one further partially shaped layer is a colored lacquer layer or vice-versa.

A preferred fourth embodiment of the multi-layer body is formed if the at least one partially shaped functional layer is a first colored lacquer layer and the at least one further partially shaped layer is a further differently colored lacquer layer.

A preferred fifth embodiment of the multi-layer body is formed if the at least one partially shaped functional layer is a first colored lacquer layer and the at least one further partially shaped layer is a dielectric reflection layer, or vice-versa.

Preferably in that case the lacquer layers are colored with at least one opaque and/or at least one transparent substance. In particular it has proven desirable if the colored lacquer layer is colored with at least one coloring agent of the color yellow, magenta, cyan or black (CMYK) or the color red, green and blue (RGB). Accordingly different color impressions can be produced by both subtractive and also by additive color mixing which for example can be produced by the above-described radiation-excitable (for example UV, IR) pigments or dyestuffs.

The above-mentioned fifth embodiment in which the multi-layer body has the at least one partially shaped functional layer in the form of a first colored lacquer layer and the at least one further partially shaped layer in the form of a dielectric reflection layer, or vice-versa, is particularly suitable for lacquer layers which have luminescent coloring agents excitable by means of UV radiation. More specifically it has been found that various transparent dielectric layers such as for example ZnS or many plastic materials do not allow UV radiation through and thus excitation of colored layers arranged therebehind in the beam path, containing luminescent coloring agents excitable by means of UV radiation, is prevented or at least impeded. Now, in the fifth embodiment, the lacquer layer can be arranged alternately in relation to the dielectric reflection layer so that the lacquer layer which is to be excited with UV radiation is preferably only to be found in regions in which the dielectric reflection layer is not in the beam path between the UV light source and the lacquer layer.

Furthermore it has proven desirable if the at least one partially shaped functional layer and/or the at least one further partially shaped layer forms/form at least region-wise a raster image made up of pixels, image points or lines which cannot be individually resolved by the human eye.

Rastering of the first layer is also possible to the effect that, besides raster elements which are underlaid with a reflection layer and which have—possibly different—diffractive diffraction structures, there are besides raster elements representing transparent regions without a reflection layer. In that respect amplitude-modulated or surface-modulated rastering can be selected as the rastering effect. Interesting optical effects can be achieved by a combination of such reflective/diffractive regions and non-reflective, transparent—under some circumstances also diffractive—regions. If such a raster image is arranged for example in a window of a value-bearing document, a transparent raster image can then be seen in the transillumination mode. In incident light that image is only visible in a given range of angles, in which no light is diffracted/reflected by the reflecting surfaces. In addition it is also possible to use such elements not only in a transparent window but also to apply them to a colored imprint. The colored imprint is visible for example in the form of the raster image in a given range of angles while in another range of angles it is not visible by virtue of the light reflected by the diffraction structures or other (macro) structures. In addition it is also possible for a plurality of outgoing reflection regions which decrease in their reflectivity to be produced by suitably selected rastering.

Finally it has proven to be optically attractive if at least two further partially shaped layers are provided.

The replication layer can be arranged on a carrier layer, for example if the replication layer is a layer which is not self-supporting or at least a very thin layer. The carrier layer is adapted to be removable or releasable in particular from the multi-layer body formed.

An embodiment of the multi-layer body in the form of a film element, in particular a transfer film, a hot embossing film or a laminating film, is advantageous. In that case the film element preferably has an adhesive layer on at least one side.

The multi-layer body however may be not only a film element but also a rigid body. Film elements are used for example to provide documents, bank notes and the like with security features. That can also involve security threads for being woven into paper or for being introduced into a card, which can be produced with the process according to the invention with a partially shaped functional layer in perfect register relationship with a further partially shaped layer. Advantageously rigid bodies such as for example an identity card, a base plate for a sensor element, semiconductor chips or surfaces of electronic devices, for example a casing portion for a cellular telephone, can also be provided with a multi-layer body according to the invention.

A security element for security or value-bearing documents, which is provided with a multi-layer body according to the invention or is formed at least partially from the multi-layer body is particularly forgery-proof and of an optically attractive nature. In particular an identity card or pass, a passport, a bank card, an identity card, a bank note, a security bond, a ticket, a security packaging or the like is considered as a security or value-bearing document. To safeguard such documents, preferably an at least partially transparent multi-layer body is arranged as a security element in particular in critical regions of the document such as the passport photograph or the signature of the holder, or over the entire document or a window opening in the document. In addition it is possible for a first item of information to be caused to be visible in such a window in a reflection mode and a second item of information to be caused to be visible in the transillumination mode. It is possible to generate new security elements with a particularly brilliant and filigree appearance. Thus it is possible for example to produce images which are semitransparent in the transillumination mode by the formation of a rastering of the at least one partially shaped functional layer and/or further partially shaped layer.

Besides the multi-layer body the security document may also have further security means such as for example printed layers containing optically variable coloring agents, magnetic layers, watermarks and so forth. In that case printed layers can be integrated into security elements or formed directly on a substrate of the security document. If printed layers are arranged on the security document, having luminescent coloring agents which are excitable by means of UV radiation, it has proven to be desirable if, for the reasons already referred to hereinbefore, they are not covered by transparent dielectric layers such as ZnS, which act as UV filters and prevent or impede excitation of the fluorescent coloring agents.

The use of printing inks which are colored under normal illumination and which in addition contain fluorescent coloring agents excitable by means of UV radiation means however that it is also possible to produce interesting optical effects when the printed image formed therefrom is partially covered by a transparent dielectric layer non-transmissive for UV radiation, and partially not. In the case of UV irradiation, the accustomed color is then still exhibited in the regions of the printed image, in which there is the transparent dielectric layer functioning as a UV filter, while a fluorescence manifestation occurs in the regions in which the UV radiation impinges directly on the printing ink of the printed image. Depending on the respective configuration of the openings in the transparent dielectric layer therefore fluorescence manifestations are produced in pattern form or in the form of alphanumeric characters and so forth, independently of the form of the printed image.

Electronic components can however also be produced with the multi-layer body according to the invention. By way of example the at least one partially shaped functional layer and/or the at least one further layer can form an electronic component, for example an antenna, a capacitor, a coil or an organic semiconductor component. The at least one partially shaped functional layer and/or the at least one further partially shaped layer can also involve a polymer so that for example the one layer can be in the form of an electrical conductor and the other layer in the form of an electrical insulator, in which case both layers can be in the form of transparent layers.

As mentioned hereinbefore it is possible to provide further layers which can be arranged on the multi-layer body in accurate register relationship, with the process of the invention. Multi-layer bodies according to the invention are suitable for example as optical components such as lens systems, exposure and projection masks. They can also be used as components or decoration elements in the field of telecommunications.

Further optical effects can be produced if the at least one partially shaped functional layer and/or the at least one further layer is or are formed from a plurality of sublayers, in particular if the sublayers form a thin film layer system.

It can be provided that the sublayers are formed from different materials. Such a configuration can be provided not just for the above-mentioned thin film layer system. In that way it is also possible for example to produce nanotechnological functional elements, for example a bimetal switch involving dimensions in the μm range can be produced from two different metallic layers.

The processes according to the invention afford many different possible options in terms of producing multi-layer bodies and the process steps are not limited to a single use in order for example to form a still more complex multi-layer body. In addition the layers of the multi-layer body can be chemically, physically or electrically treated at any point in the process implementation in order for example to alter mechanical or chemical resistance or to influence another property of the respective layer.

Independently of the above-described invention protection is also here quite generally claimed for a security element and the production thereof, having a transparent dielectric layer which is opaque to UV radiation, in particular a reflection layer, which is provided with openings, wherein viewed perpendicularly to the plane of the dielectric layer a lacquer layer containing luminescent coloring agents excitable by means of UV radiation is arranged on the side of the dielectric layer remote from the viewing person, at least partially and at least in the region of the openings thereof.

BRIEF DESCRIPTION OF THE DRAWINGS

The invention is described by way of example with reference to the drawings in which:

FIG. 22(A) through 23(B) show diagrammatic views of various security documents including multi-layer bodies.

DETAILED DESCRIPTION OF THE INVENTION

Figure 1:
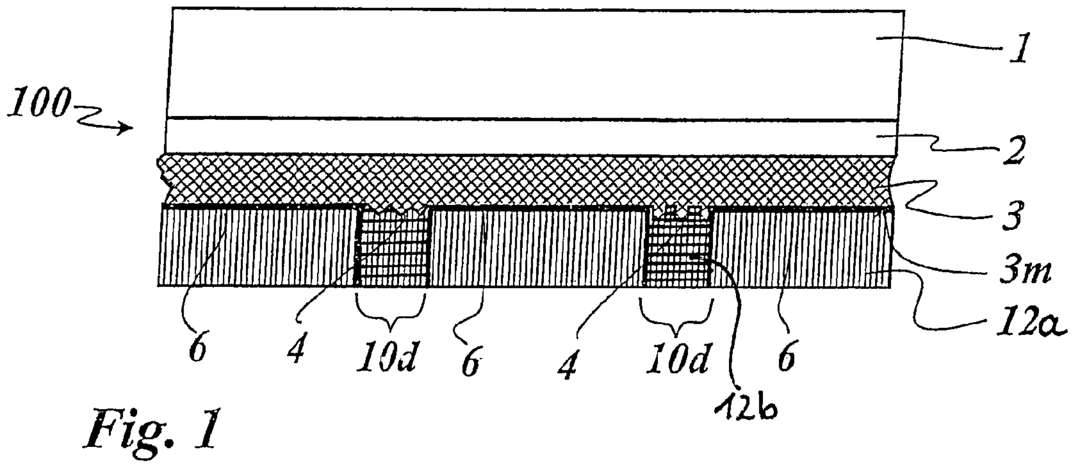
FIG. 1 shows a diagrammatic sectional view of a first embodiment of a multi-layer body according to the invention.

FIG. 1 shows a multi-layer body 100 in which arranged on a carrier film 1 are a functional layer 2, a replication layer 3, a structured first layer **3*m* of aluminum and two differently colored, transparent photoresist layers 12*a*, 12*b*, in register relationship with the first layer 3*m*. The functional layer 2 is a layer which serves principally to increase the mechanical and chemical stability of the multi-layer body but which can also be adapted in known manner to produce optical effects, in which respect it can also be provided that the layer is formed from a plurality of sublayers. It may also be a layer which is made from wax or which is in the form of a release layer. It is however also possible to dispense with that layer and to arrange the replication layer 3 directly on the carrier film 1. It can further be provided that the carrier film 1** itself is in the form of a replication layer.

The multi-layer body 100 can be a portion of a transfer film, for example a hot embossing film, which is applied to a substrate by means of an adhesive layer (not shown here). The adhesive layer can be a hot melt adhesive which melts under the effect of heat and permanently bonds the multi-layer body to the surface of the substrate.

The carrier film 1 can be in the form of a mechanically and thermally stable film of PET.

Regions with different relief structures can be shaped in the replication layer 3 by means of known processes. The illustrated embodiment has first regions 4 with diffractive relief structures and second regions which are flat regions 6.

The first layer **3*m* on the replication layer 3 has demetalized regions 10*d* arranged in coincident relationship with the first regions 4. The multi-layer body 100 appears transparent or partially transparent in the regions 10*d***.

FIGS. 2 through 8 now show the production stages for the multi-layer body 100. Identical elements as in FIG. 1 are denoted by the same references.

Figure 2:
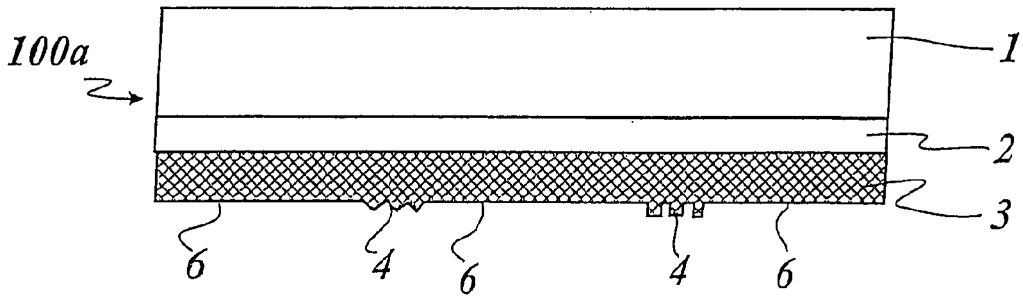
FIG. 2 shows a diagrammatic sectional view of the first production stage of the multi-layer body of FIG. 1.

FIG. 2 shows a multi-layer body **100*a* in which the functional layer 2 and the replication layer 3 are arranged on the carrier film 1**.

The replication layer 3 is surface-structured by known processes. For that purpose for example a thermoplastic replication lacquer is applied as the replication layer 3 by printing, spraying or lacquering and a relief structure is shaped in the replication lacquer by means of a heated punch or a heated replication roller.

The replication layer 3 can also be a UV hardenable replication lacquer which is structured for example by a replication roller. The structuring however can also be produced by UV radiation through an exposure mask. In that way the regions 4 and 6 are shaped in the replication layer 3. The region 4 can be for example the optically active regions of a hologram or a Kinegram® security feature.

Figure 3:
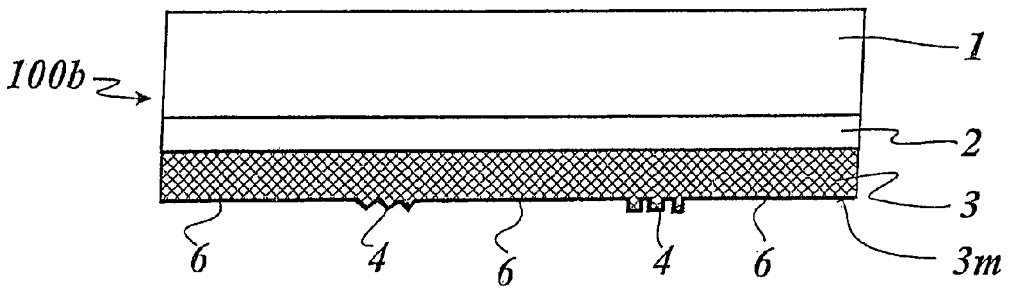
FIG. 3 shows a diagrammatic sectional view of the second production stage of the multi-layer body of FIG. 1.

FIG. 3 now shows a multi-layer body **100*b* formed from the multi-layer body 100*a* in FIG. 2, by a procedure whereby the first layer 3*m* is applied to the replication layer 3 with a uniform density with respect to surface area, in relation to a plane defined by the replication layer 3, for example by sputtering. In this embodiment the first layer 3*m* is of a layer thickness of some 10 nm. The layer thickness of the first layer 3*m* can preferably be so selected that the regions 4 and 6, are of low transmission, for example between 100% and 0.001%, that is to say they involve an optical density of between 1 and 5, preferably between 1.5 and 3. The optical density of the first layer 3*m*, that is to say the negative common logarithm of transmission, is accordingly in the regions 4 and 6 between 1 and 3. It can preferably be provided that the first layer 3*m* is formed with an optical density of between 1.5 and 2.5. The regions 4 and 6** therefore appear opaque to the eye of the viewer.

It is particularly advantageous here for the first layer **3*m* to be applied in a layer thickness at which the first layer 3*m* is substantially opaque upon being applied to a planar surface, that is to say as in the regions 6, and involves an optical density of greater than 2. The thicker the first layer 3*m* applied to the replication layer 3, the correspondingly greater is the effect of the change, caused by the diffractive relief structure provided in the regions 4, in the effective optical layer thickness on the transmission characteristics of the first layer 3*m*. Investigations have shown that the change in the effective optical density of the first layer 3*m*, that is caused by the diffractive relief structure, is approximately proportional to the vapor-deposited layer thickness and thus approximately proportional to the optical density. As the optical density represents the negative logarithm of transmission, the difference in transmission between the regions 4 and 6 is overproportionally increased in that way by increasing the application of material of the first layer 3*m***, in relation to surface area.

It will be noted that the optical densities of the first layer **3*m* differ in the regions 4 and 6 in such a way that it is reduced in the regions 4 in relation to the regions 6. The responsibility for this lies with the enlargement in surface area in the regions 4 because of the depth-to-width ratio of the structure elements that differs from zero and the thickness of the first layer 3*m*, that is reduced as a result. The dimensionless depth-to-width ratio and the spatial frequency are characterizing features in regard to the enlargement of the surface area of preferably periodic structures. Such a structure forms in a periodic succession "peaks" and "troughs". Here the spacing between a "peak" and a "trough" is referred to as the depth while the spacing between two "peaks" is referred to as the "width". Now, the greater the depth-to-width ratio, the correspondingly steeper are the "peak flanks" and the correspondingly thinner is the first layer 3***m* deposited on the "peak flanks". That effect is also to be observed when the situation involves discretely distributed "troughs" which can be arranged relative to each other at a spacing which is a multiple greater than the depth of the "troughs". In such a case the depth of the "trough" is to be related to the width of the "trough" in order to correctly describe the geometry of the "trough" by specifying the depth-to-width ratio.

In the production of regions of reduced optical density it is important to know and appropriately select the individual parameters in their dependencies. The degree of reduction in optical density can vary in dependence on the background, illumination and so forth. An important part is played in that respect by the absorption of light in the first layer. For example chromium and copper reflect much less under some circumstances.

Table 1 shows the ascertained degree of reflection of first layers of metal arranged between plastic films (refractive index n=1.5), here comprising Ag, Al, Au, Cr, Cu, Rh and Ti with a light wavelength λ=550 nm. In that case the thickness ratio ∈ is formed as a quotient of the thickness t of the metal layer that is required for the degree of reflection R=80% of the maximum $R_{max}$ and the thickness required for the degree of reflection R=20% of the maximum $R_{max}$.

TABLE 1

| Metal | $R_{max}$ | t for 80% $R_{max}$ | t for 20% $R_{max}$ | ε | h/d |
|---|---|---|---|---|---|
| Ag | 0.944 | 31 nm | 9 nm | 3.4 | 1.92 |
| Al | 0.886 | 12 nm | 2.5 nm | 4.8 | 2.82 |
| Au | 0.808 | 40 nm | 12 nm | 3.3 | 1.86 |
| Rh | 0.685 | 18 nm | 4.5 nm | 4.0 | 2.31 |
| Cu | 0.557 | 40 nm | 12 nm | 3.3 | 1.86 |
| Cr | 0.420 | 18 nm | 5 nm | 3.6 | 2.05 |
| Ti | 0.386 | 29 nm | 8.5 nm | 3.3 | 1.86 |

On the basis of heuristic consideration, silver and gold (Ag and Au), as can be seen, have a high maximum degree of reflection $R_{max}$ and require a relatively low depth-to-width ratio of a relief structure to reduce the optical density of the first layer, in the foregoing example to afford transparency. Aluminum (Al) admittedly has also a high maximum degree of reflection $R_{max}$, but it requires a higher depth-to-width ratio of the relief structure. Preferably therefore it can be provided that the first layer is made of silver or gold. It can however also be provided that the first layer is made from other metals, metal alloys or functional layer materials.

Table 2 now shows the calculation results obtained from strict diffraction calculations for relief structures, in the form of linear sinusoidal gratings with a grating spacing of 350 nm, with different depth-to-width ratios. The relief structures are coated with silver with a nominal thickness $t_0$=40 nm. The light incident on the relief structures is of the wavelength λ=550 nm (green) and is TE polarized and TM polarized respectively.

TABLE 2

| Depth-to-width ratio | Grating spacing in nm | Depth in nm | Degree of reflection (0R) TE | Degree of transparency (0T) TE | Degree of reflection (0R) TM | Degree of transparency (0T) TM |
|---|---|---|---|---|---|---|
| 0 | 350 | 0 | 84.5% | 9.4% | 84.5% | 9.4% |
| 0.3 | 350 | 100 | 78.4% | 11.1% | 50.0% | 21.0% |
| 0.4 | 350 | 150 | 42.0% | 45.0% | 31.0% | 47.0% |
| 1.1 | 350 | 400 | 2.3% | 82.3% | 1.6% | 62.8% |
| 2.3 | 350 | 800 | 1.2% | 88.0% | 0.2% | 77.0% |

As was found, in particular the degree of transparency or transmission, apart from the depth-to-width ratio, is dependent on the polarization of the incident light. That dependency is illustrated in Table 2 for the depth-to-width ratio h/d=1.1. It is possible to use that effect for the selective formation of further partially shaped layers.

It was further found that the degree of transparency or reflection of the metal layer is wavelength-dependent. That effect is particularly highly pronounced for TE polarized light.

It was further found that the degree of transparency or transmission decreases if the angle of incidence of the light differs from the normal angle of incidence, that is to say the degree of transparency decreases if the light is not perpendicularly incident. That means that the first layer 3*m* can be of a transparent or less opaque nature than in the reflecting regions 6, only in a limited cone of incidence of the light. It can therefore be provided that the first layer 3*m* is opaque when inclined illumination is involved, in which respect that effect is also useful for the selective formation of further partially shaped layers.

Besides the depth-to-width ratio of a relief structure the variation in optical density is also influenced by the spatial frequency of the relief structure. Thus it has further been found that a variation in the transmission characteristics of a first layer applied to a relief structure can be achieved if the product of spatial frequency and relief depth in a first region of the relief structure is greater than the product of spatial frequency and relief depth in a second region of the relief structure.

The provision of regions involving different transparency or transmission however can also be achieved by other effects, for example by:

- the polarization dependency of transmission as a consequence of differently oriented structures;
- the form factor of the relief structures, that is to say relief structures of rectangular, sinusoidal, sawtooth or other profile can have a different transmission characteristic with the same product of spatial frequency and relief depth; and
- directed vapor deposition of the first layer in combination with special relief structures or relief structure combinations or arrangements.

If the first relief structure is a structure with a stochastic profile, for example a matt structure, correlation length, roughness depth and statistical distribution of the profile can be typical parameters which influence transmission.

Thus, to produce regions involving different transparency or transmission it is also possible to use in the first region and in the second region, relief structures which differ in one or more of the above-listed parameters.

Figure 4:
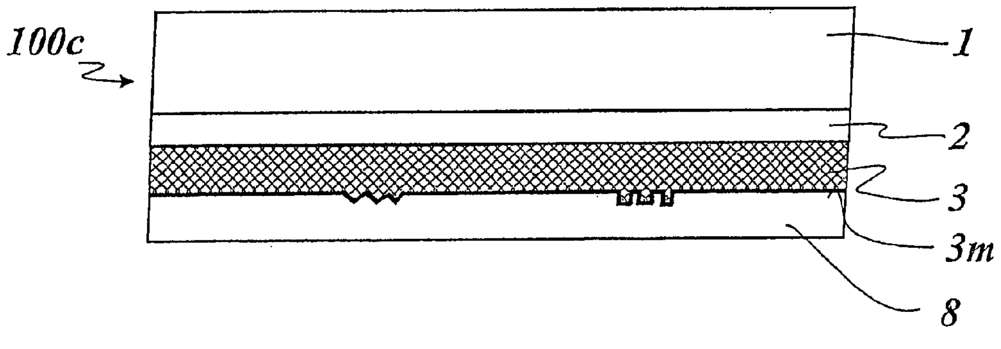
FIG. 4 shows a diagrammatic sectional view of the third production stage of the multi-layer body of FIG. 1.

FIG. 4 shows a multi-layer body 100*c* formed from the multi-layer body 100*b* shown in FIG. 3 and a photosensitive layer 8. This can involve an organic layer applied by classic coating processes such as intaglio printing in liquid form. It can also be provided that the photosensitive layer 8 is vapor-deposited or applied by lamination as a dry film.

The photosensitive layer 8 can be for example a positive photoresist such as AZ 1512 or AZ P4620 from Clariant or S1822 from Shipley which is applied to the first layer 3*m* in a density in relation to surface area of between 0.1 $g/m^2$ and 50 $g/m^2$. The layer thickness depends on the desired resolution and the procedure involved. Thus with lift-off procedures rather thicker layers of a layer thickness >1 μm are wanted, corresponding to a density in relation to surface area of about 1 $g/m^2$. Preferred weights in relation to surface area are in the range of between 0.2 $g/m^2$ and 10 $g/m^2$.

Here the application is over the entire surface area. It is however also possible to provide for application in partial regions, for example in regions arranged outside the above-mentioned regions 4 and 6. These can involve regions which have to be only relatively roughly arranged in register relationship with the design, for example decorative pictorial representations such as for example random patterns or patterns formed from repeated images or texts.

Figure 5:
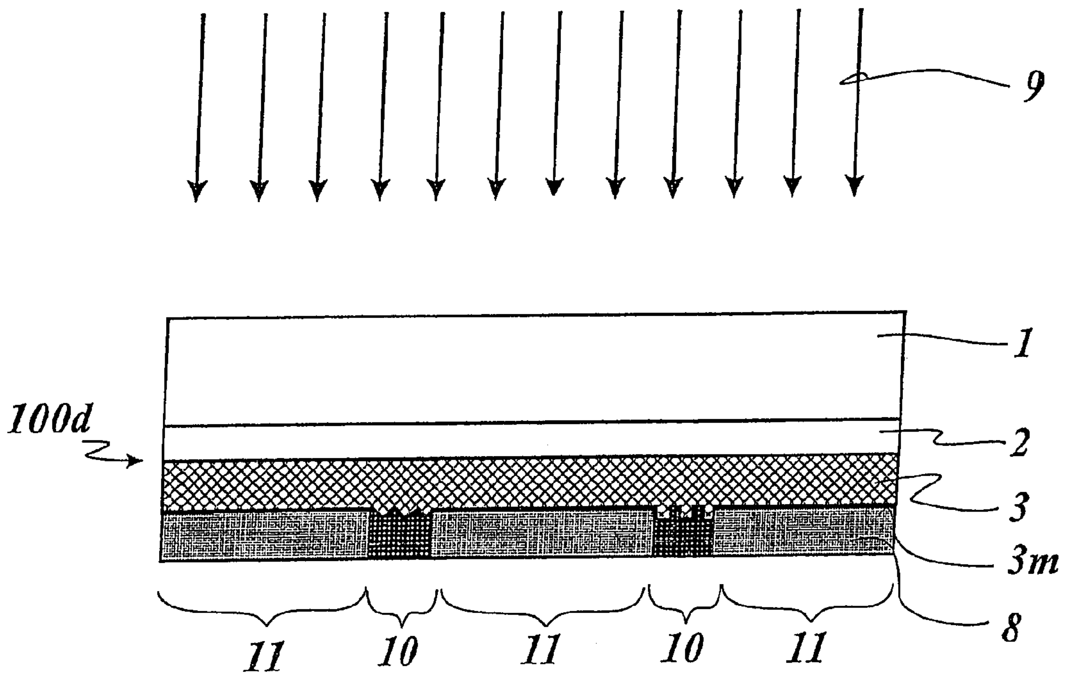
FIG. 5 shows a diagrammatic sectional view of the fourth production stage of the multi-layer body of FIG. 1, FIG. **5*a* shows a diagrammatic sectional view of a modified embodiment of the production stage shown in FIG. 5.

FIG. 5 now shows a multi-layer body 100*d* formed by exposure of the multi-layer body 100*c* in FIG. 4 through the carrier film 1. UV light 9 can be provided for exposure purposes. Because now, as described hereinbefore, the regions 4 of the first layer 3*m*, which are provided with diffractive structures having a depth-to-width ratio of greater than zero, are of lesser optical density than the reflecting regions 6 of the first layer 3*m*, the UV radiation will produce regions 10 which are exposed to a greater degree, in the photosensitive layer 8, those regions 10 differing in their chemical properties from less exposed regions 11.

The FIG. 5 embodiment provides for homogenous exposure which is produced in all regions of the multi-layer body 100*d* with equal intensity. It is however also possible to provide for partial exposure, for example to a) leave structures with a high depth-to-width ratio as design elements and not to demetallize them;

b) introduce an additional item of information, for example through a mask in belt form, which moves with the multi-layer body 100*d* during the exposure operation; and c) to introduce an individual item of information such as for example a serial number.

It can be provided in that respect that an identification is introduced by way of brief exposure by means of a programmable three-dimensional light modulator or a controlled laser.

The wavelength and polarization of the light and the angle of incidence of the light are illumination parameters which make it possible to emphasize and selectively process relief structures in a specifically targeted fashion.

Chemical properties can also be used for that purpose. The regions 10 and 11 can differ for example by their solubility in solvents. In that way the photosensitive layer 8 can be "developed" after exposure with UV light, as is further shown in FIG. 6. In the "development" of the photosensitive layer 8 regions 10 or 11 are removed in the photosensitive layer 8.

If a depth-to-width ratio >0.3 is usually provided in the regions 4 to afford a transparency which is visible to the human eye, it has surprisingly been found that the depth-to-width ratio which is sufficient for development of the photosensitive layer 8 can be substantially less. There is also no need for the first layer 3*m* to be so thin that the regions 4 appear transparent when viewed visually. The vapor-deposited carrier film can therefore be opaque for the reduced transparency can be compensated by the increased exposure dose of the photosensitive layer 8. It is further to be borne in mind that exposure of the photosensitive layer 8 is typically provided in the near UV range so that the visual viewing impression is not crucial in terms of assessing the optical density.

Figure 5A:
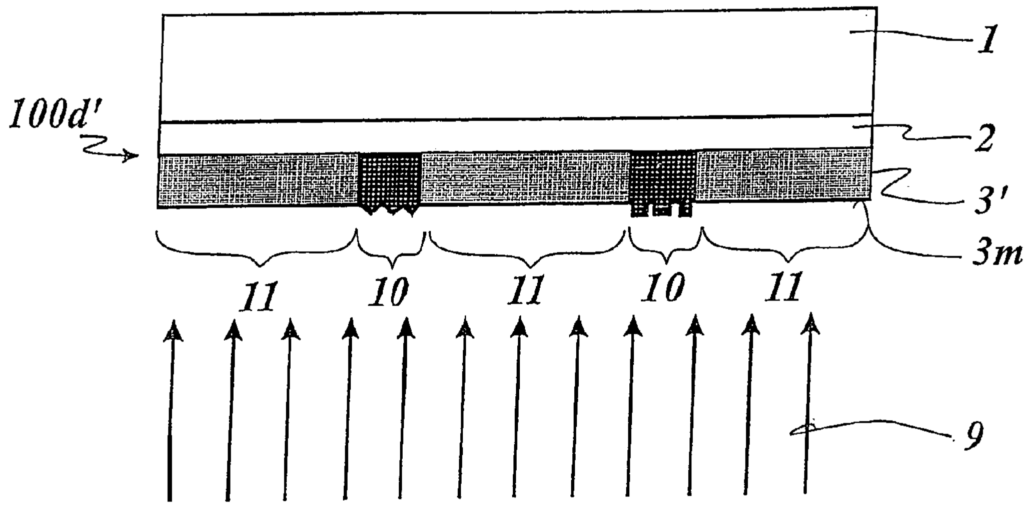
FIG. 5*b* shows a diagrammatic sectional view of the production stage following the production stage of FIG. 5*a*,**
Figure 5B:
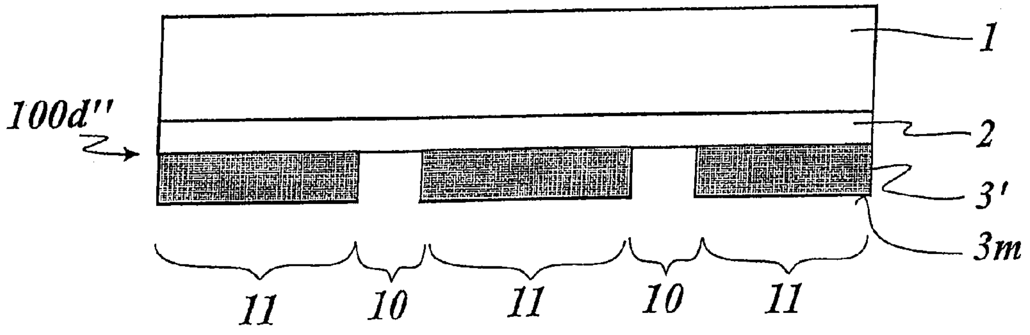

FIGS. 5*a* and 5*b* a modified embodiment. The multi-layer body 100*d*' in FIG. 5*a* does not have the photosensitive layer 8 shown in FIG. 5. Instead there is replication layer 3' which is a photosensitive wash lacquer layer colored with a thermochromic substance. The multi-layer body 100*d*' is exposed from below through the first layer 3*m*, whereby the replication layer 3' is altered in the more greatly exposed regions 10 in such a way that it can be washed off.

FIG. 5*b* now shows a multi-layer body 100*d*" resulting from the multi-layer body 100*d*' after the washing process. In the regions 10 the first layer 3*m* has been removed at the same time during the washing process with the replication layer 3'. The structured replication layer 3' forms a first partially shaped thermochromic functional layer, while the first layer 3*m* forms in perfect register relationship therewith a first further partially shaped layer of aluminum.

Figure 6:
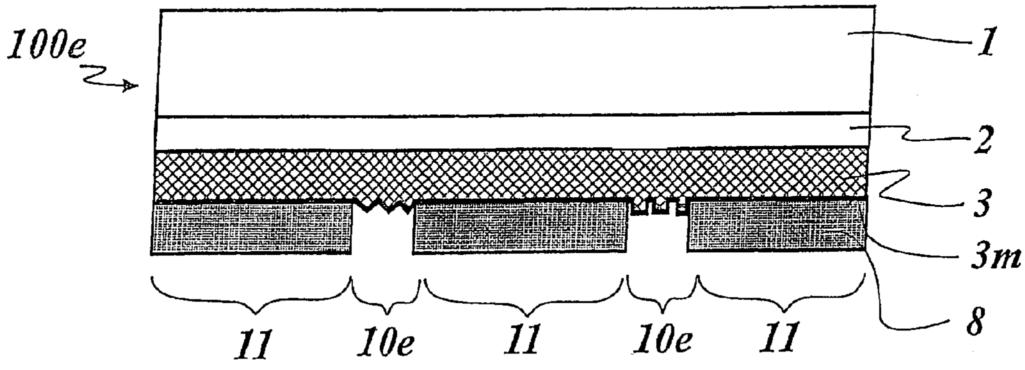
FIG. 6 shows a diagrammatic sectional view of the fifth production stage of the multi-layer body of FIG. 1.

FIG. 6 shows the "developed" multi-layer body 100*e* formed from the multi-layer body 100*d* by the action of a solvent applied to the surface of the exposed photosensitive layer 8. That now provides for the formation of regions 10*e* in which the photosensitive layer 8 is removed. The regions 10*e* are the regions 4 described in FIG. 3 with a depth-to-width ratio of greater than zero for the structure elements. The photosensitive layer 8 is produced in regions 11 because this involves the regions 6 which are described in FIG. 3 and in which the structure elements have a depth-to-width ratio equal to zero. If a transparent positive photoresist colored with blue color pigment is used as the photosensitive layer 8, a partially shaped transparent blue functional layer is thus formed in register relationship with the relief structure.

In the embodiment shown in FIG. 6 therefore the photosensitive layer 8 is formed from a positive photoresist. With such a photoresist the exposed regions are soluble in the developer. In contrast thereto, with a negative photoresist, the unexposed regions are soluble in the developer, as set forth hereinafter in the embodiment illustrated in FIGS. 9 through 12.

Figure 7:
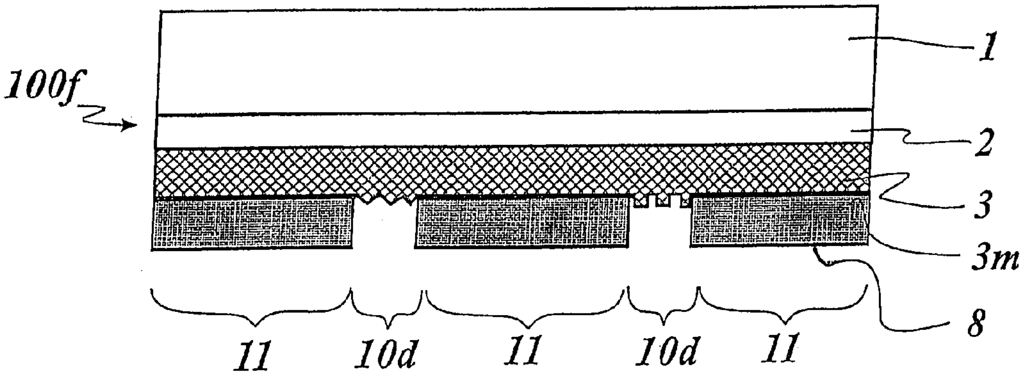
FIG. 7 shows a diagrammatic sectional view of the sixth production stage of the multi-layer body of FIG. 1.

Now, as shown by reference to a multi-layer body 100*f* in FIG. 7 the first layer 3*m* can be removed in the regions 10*e* which are not protected from the attack of the etching agent by the developed photosensitive layer 8 serving as an etching mask. The etching agent can be for example an acid or lye. The regions 10*d* also shown in FIG. 1 are produced in that way. The structured photosensitive layer 8 forms the first partially shaped transparent blue functional layer while the first layer 3*m* after the etching operation forms in perfect register relationship therewith a first further partially shaped layer of aluminum.

In that way therefore the first layer 3*m* can be structured in accurate register relationship without involving additional technological endeavor. No expensive precautions have to be taken for that purpose, such as for example when applying an etching mask by mask exposure or printing. Tolerances >0.2 mm are usual with such a conventional process. In contrast, with the process according to the invention, tolerances in the μm range down to the nm range are possible, that is to say tolerances which are only determined by the origination and the replication process selected for structuring of the replication layer.

It can be provided that the first layer 3*m* is produced as a succession of various metals and the differences in the physical and/or chemical properties of the metallic layer portions are put to use. For example it can be provided that the first metallic layer portion deposited is aluminum which has a high level of reflection and therefore means that reflecting regions stand out well, when viewing the multi-layer body from the carrier side. Chromium can be deposited as the second metallic layer portion, which has a high level of chemical resistance to various etching agents. The etching process for the first layer 3*m* can now be implemented in two stages. It can be provided that the chromium layer is etched in the first stage, in which case the developed photosensitive layer 8 is used as the etching mask, and then the aluminum layer is etched in the second stage, in which case the chromium layer now serves as the etching mask.

Such multi-layer systems allow a greater degree of flexibility in the choice of the materials used in the production procedure for the photoresist, for the etching agents and for the first layer 3*m*.

Figure 8:
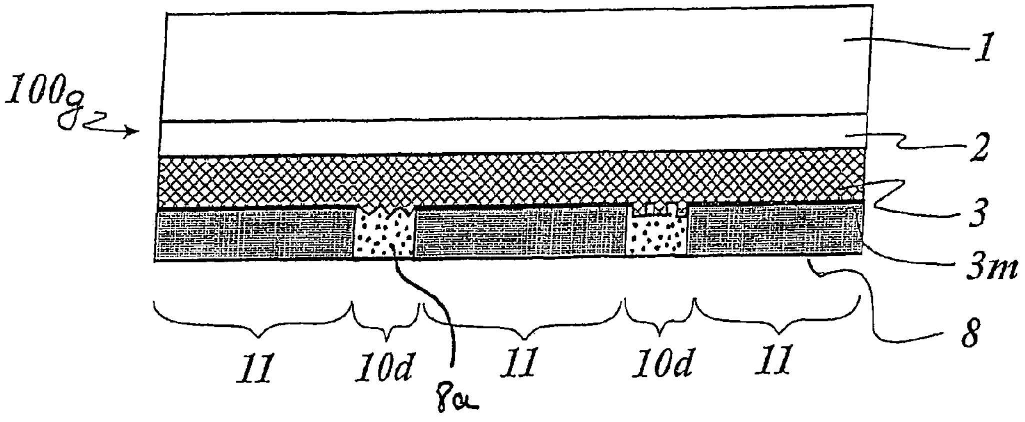
FIG. 8 shows a diagrammatic sectional view of a further multi-layer body.

FIG. 8 shows the optional possibility, after the production step shown in FIG. 7, of raking a layer 8*a* of transparent printing ink containing luminescent pigments into the first regions 10*d*. FIG. 8 shows a multi-layer body 100*g*, formed from the carrier film 1, the functional layer 2, the replication layer 3, the structured first layer 3*m* of aluminum as a first further partially shaped layer, the structured transparent blue photosensitive layer 8 as a first partially shaped functional layer and the partially shaped further layer 8*a* of transparent luminescent printing ink as a second partially shaped functional layer.

Figure 9:
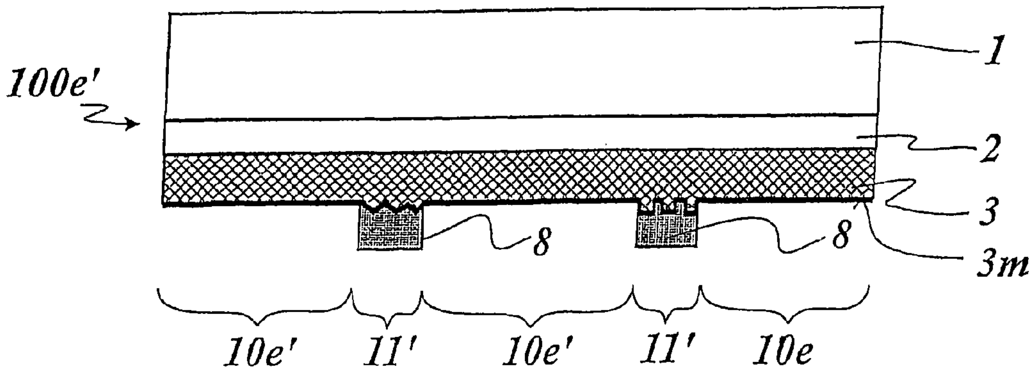
FIG. 9 shows a diagrammatic sectional view of a further multi-layer body.

FIG. 9 now shows a second embodiment of a multi-layer body 100*e*' in which, instead of the photosensitive layer 8 of positive photoresist (as shown in FIGS. 5, 6, 7 and 8), a photosensitive layer 8 of negative photoresist was used. As can be seen from FIG. 9 a multi-layer body 100*e*' has regions 10*e*' in which the unexposed photosensitive layer 8 was removed by the development operation. The regions 10*e*' are opaque regions of first layer 3*m*. The exposed photosensitive layer 8 is not removed in regions 11', these are transmissive regions of the first layer 3*m*, that is to say regions of lesser optical density than in the regions 10*e'*.

Figure 10:
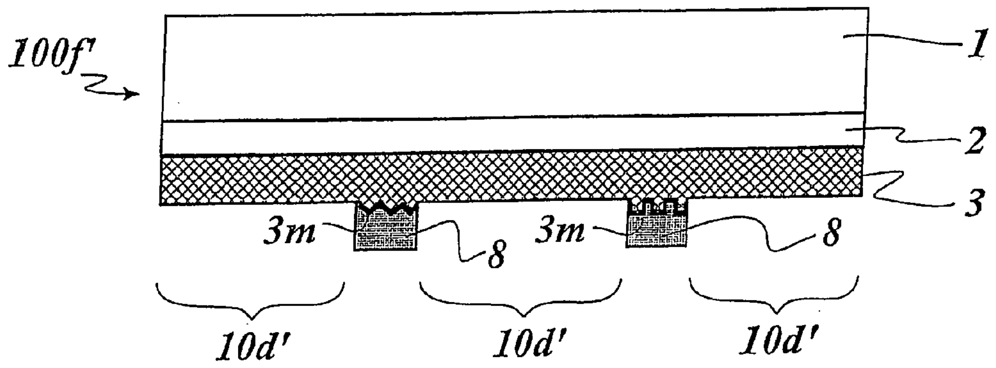
FIGS. 10 through 13 show diagrammatic sectional views of further process steps relating to the first process.

FIG. 10 shows a multi-layer body 10*f*" formed by removal of the first layer 3*m* by an etching process from the multi-layer body 100*e*' (FIG. 9). For that purpose the developed photosensitive layer 8 is provided as an etching mask which is removed in the regions 10*e*' (FIG. 9) so that there the etching agent can break down the first layer 3*m*. Formed in that way are regions 10*d*' which no longer have a first layer 3*m*. In that case the partially shaped layer 8 can be in the form of an opaque, black-colored lacquer layer and can form the partially shaped functional layer while the partially shaped first layer 3*m* forms the further layer.

Figure 11:
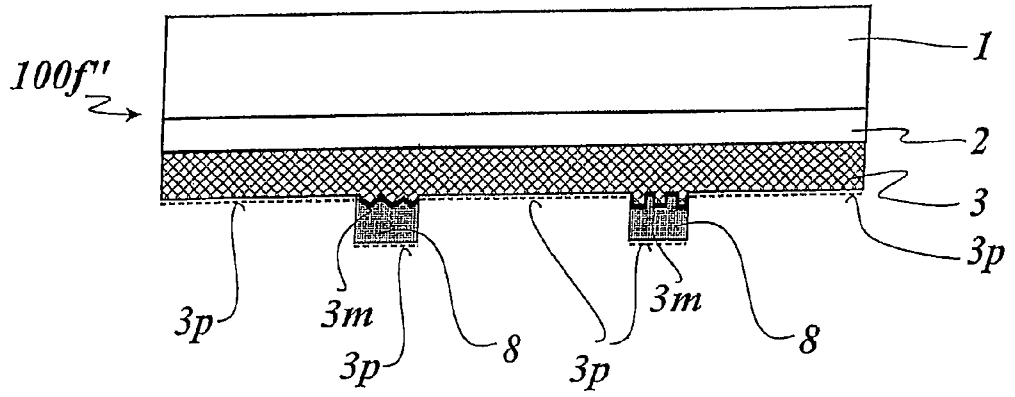

As illustrated in FIG. 11, a multi-layer body 100*f*" is now formed from the multi-layer body 100*f*', by a reflecting layer 3*p* comprising a dielectric such as $TiO_2$ or ZnS being applied over the full surface area. Such a layer can be applied for example over the surface area by vapor deposition, in which case it can be provided that that layer is formed from a plurality of mutually superposed thin layers which for example can differ in their refractive index and which in that way can produce interference color effects in the light shining thereon. A thin layer succession involving color effects can be formed for example from three thin layers with a high-low-high index configuration. The color effect appears less striking in comparison with metallic reflecting layers, which is advantageous for example if patterns are produced in that fashion on passports or ID cards. The patterns can appear to the viewing person for example as transparent green or red.

Figure 12:
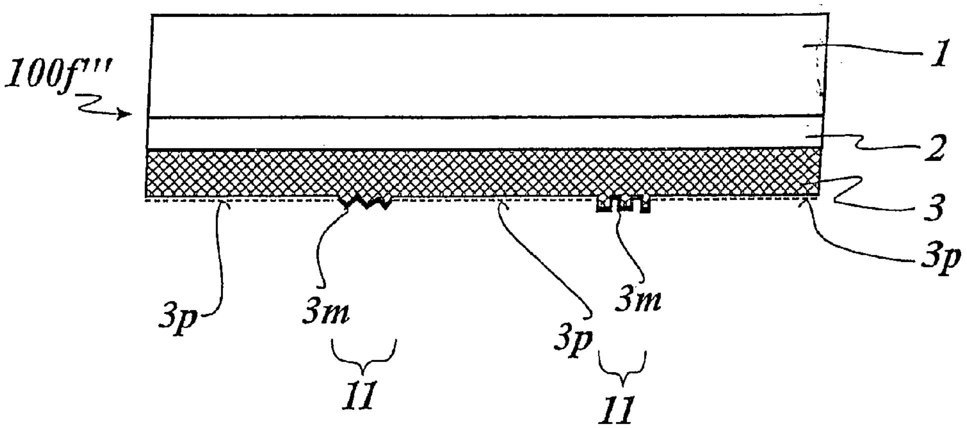

FIG. 12 now shows a multi-layer body 100*f*'" formed from the multi-layer body 100*f*" (FIG. 11) after removal of the remaining photosensitive layer 8. This can involve a conventional "lift-off" procedure. In that way, at the same time as the photosensitive layer 8, the dielectric layer 3*p* applied thereto in the previous step is removed again. That therefore now involves the formation on the multi-layer body 100*f*'" of adjacent regions with the dielectric layer 3*p* and the first layer 3*m* of aluminum, which differ from each other for example in their optical refractive index and/or their electrical conductivity.

It can now be provided that the first layer 3*m* is galvanically reinforced and in that way the regions 11 are produced for example in the form of regions enjoying particularly good electrical conductivity. Subsequently a transparent, UV hardenable liquid crystal can be applied over the full surface area as a quasi-negative photoresist and exposed through the carrier layer 1. The less exposed or unexposed regions of the photoresist layer are disposed over the partially shaped first layer 3*m* and are removed. The result is a multi-layer body (not shown separately here) which has a first partially shaped functional layer of transparent photoresist, a first further partially shaped layer in the form of the dielectric layer 3*p* and a second partially shaped further layer in the form of the first layer 3*m*.

It can alternatively or subsequently be provided that the regions 11 are transparent and for that purpose the first layer 3*m* is removed by etching. It is possible to provide an etching agent which does not attack the dielectric layer 3*p* applied in the other regions. It can however also be provided that the etching agent is caused to act only until the first layer 3*m* is no longer recognizable from the point of view of visual impression.

Figure 13:
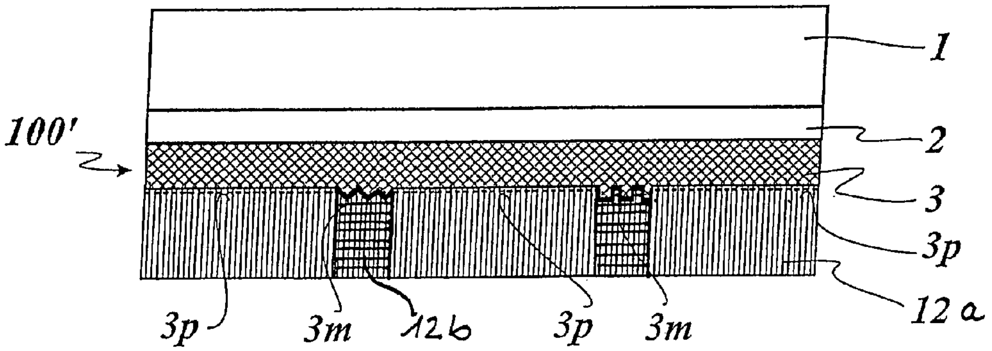

FIG. 13 now shows a multi-layer body 100' formed from the multi-layer body 100*f*'" (FIG. 12) by the addition of the photoresist layers 12*a*, 12*b* shown in FIG. 1. The multi-layer body 100' has been produced, like the multi-layer body 100 shown in FIG. 1, by use of the same replication layer 3. It is therefore possible with the process according to the invention, starting from a unitary layout, to produce multi-layer bodies of differing configurations.

The process according to the invention can be further continued without losses of quality to structure further layers in accurate register relationship. For that purpose it can be provided that further optical effects such as total reflection, polarization and spectral transmissiveness of the previously applied layers are used for producing regions of different optical density in order to form exposure masks in accurate register relationship.

It can also be provided that a differing level of local absorption capability is produced by means of mutually superposed layers and exposure or etching masks are formed by laser-supported thermal ablation.

Figure 14:
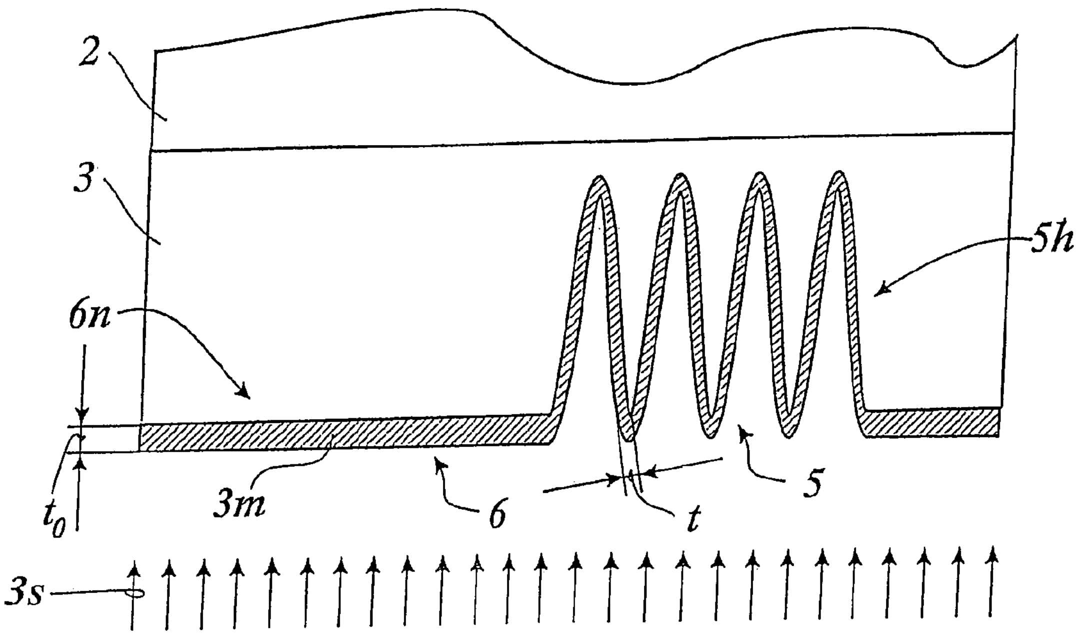
FIG. 14 shows a diagrammatic sectional view relating to the first process.

FIG. 14 now shows in detail the layer thickness modification effect, for the first layer 3*m*, that is responsible for producing the differing degree of transmission, in particular transparency.

FIG. 14 shows a diagrammatic sectional view of a portion on an enlarged scale from a layer structure as shown in FIG. 3. The replication layer 3, in the region 5, has a first relief structure 5*h* with a high depth-to-width ratio >0.3 while in the region 6 it does not have any relief structure or it has a flat region. Arrows 3s denote the direction of application of the first layer 3m which is applied here by sputtering. The first layer 3m is produced with the nominal thickness $t_0$ in the flat region 6n while in the region of the first relief structure 5h it is produced with the thickness t which is less than the nominal thickness $t_0$. In that respect the thickness t is to be interpreted as a mean value for the thickness t is formed in dependence on the angle of inclination of the surface of the first relief structure 5h with respect to the horizontal. That angle of inclination can be described mathematically by the first derivative of the function of the first relief structure 5h.

If therefore the angle of inclination is equal to zero the first layer 3m is deposited with the nominal thickness $t_0$, if the magnitude of the angle of inclination is greater than zero, the first layer 3m is deposited with the thickness t, that is to say a smaller thickness than the nominal thickness $t_0$.

Figure 15:
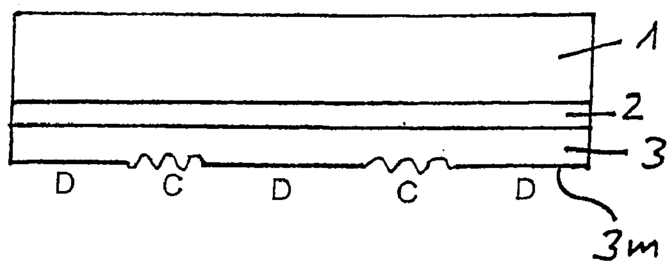
FIGS. 15(A) through (F) show further diagrammatic sectional views relating to the first process.
FIG. 15(G) shows a plan view of a multi-layer body formed in accordance with the process of FIGS. 15(A) through (F), FIGS. 16(A) through (C) show further diagrammatic sectional views relating to the first process.
Figure 15:
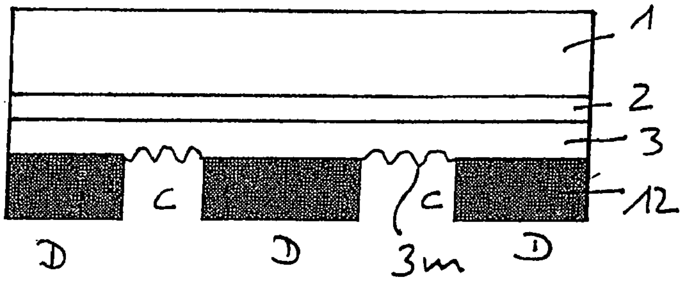
Figure 15:
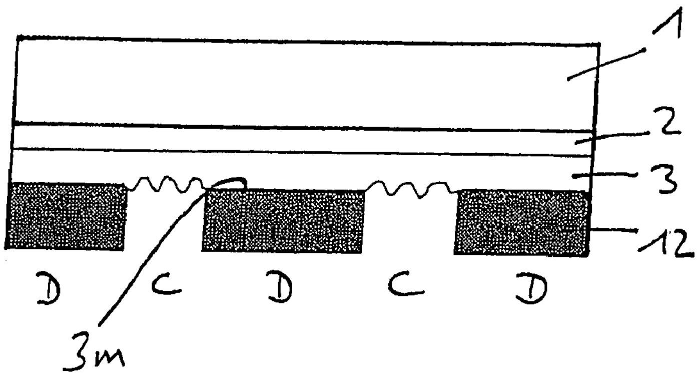
Figure 15:
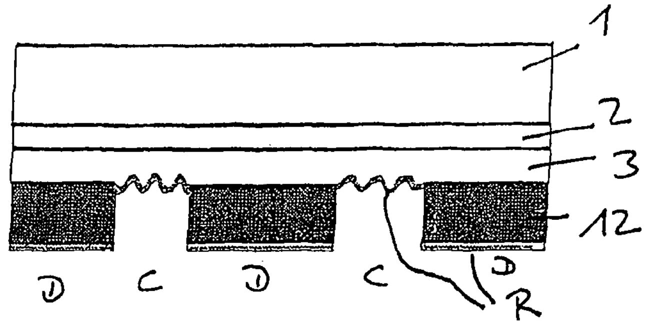
Figure 15:
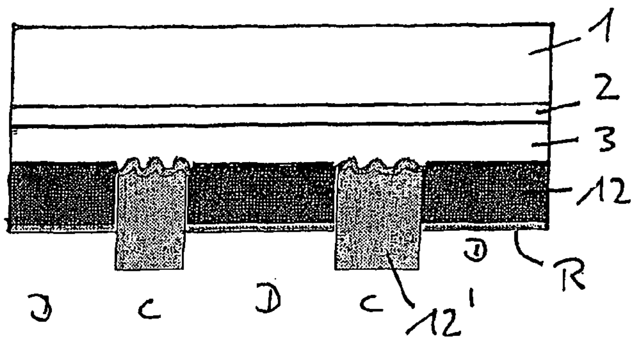
Figure 15:
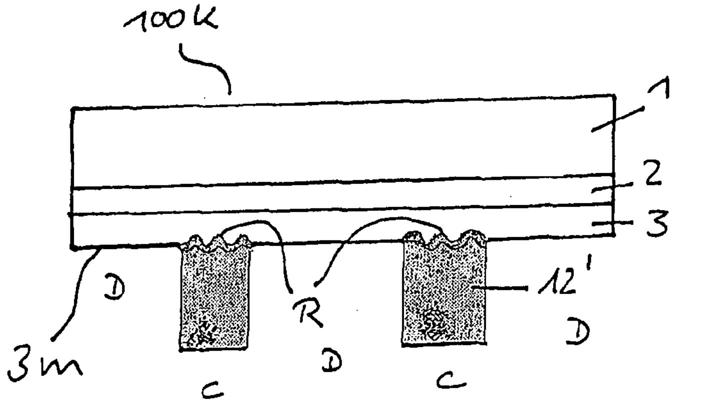
Figure 15:
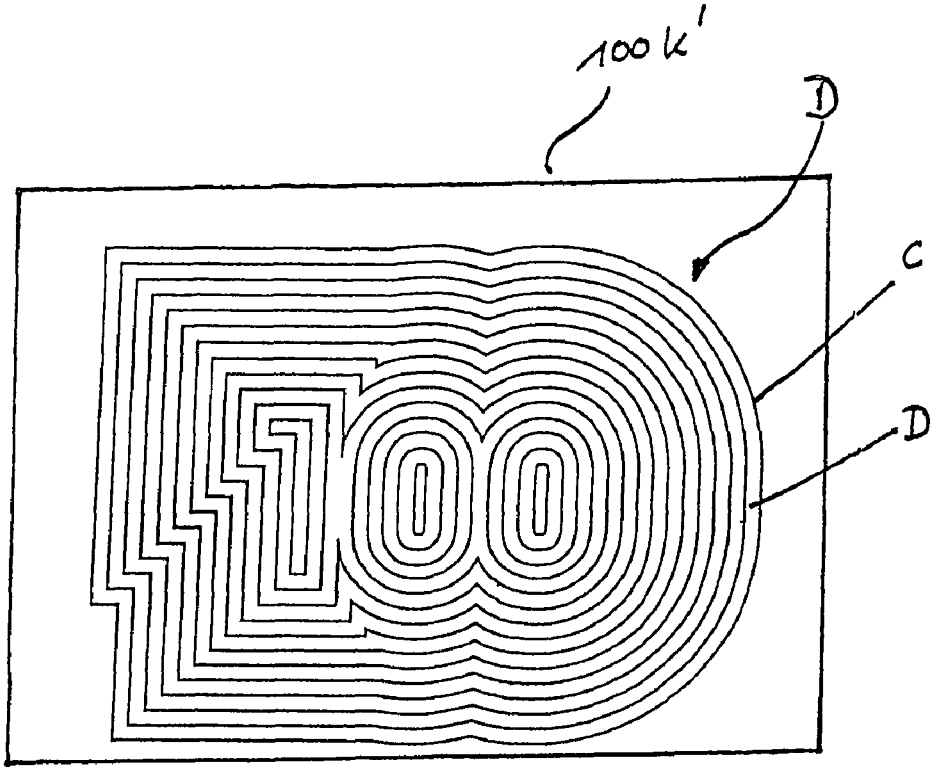

FIG. 15 a view in cross-section of a carrier layer 1 of PET, at least one functional layer 2 and a replication layer 3. In the first regions C a first kinematic relief structure is shaped in the replication layer 3. No relief structure is shaped in the second regions D. The replication layer 3 is thereupon vapor-deposited over its full area with a first layer 3m of silver, in which case regions involving different transmissivity are produced in the first layer 3m in register relationship with the regions C and D.

Referring to 15(B), a positive photoresist layer 12 is applied to the layer composite shown in FIG. 15(A) over the full surface area, and exposed through the carrier layer 1. The more greatly exposed or generally exposed regions C of the photoresist layer 12 are removed and the subjacent first layer 3m exposed in the region of the relief structure.

Referring to FIG. 15(C) the first layer 3m is now removed in the regions C by etching, with the structured photoresist layer 12 serving as an etching mask. After the etching operation only the structured first layer 3m is present between the photoresist layer 12 and the replication layer 3.

Referring to FIG. 15(D) a dielectric reflection layer R of ZnS with a high refractive index or a thin film reflection layer stack with a viewing angle-dependent interference color effect is now applied by vapor deposition over the full surface area involved. The photoresist layer 12 can possibly be previously removed.

The layer stack shown in FIG. 15(D) is now covered over its full surface area with a red-colored negative photoresist layer 12' and exposed through the carrier layer 1. FIG. 15(E) shows the result after removal of the negative photoresist layer 12' in the non-exposed regions D.

Finally, layers which are possibly no longer required are now removed in the flat second region D, by the structured photoresist layer 12 being dissolved away and the regions, arranged thereon, of the dielectric reflection layer R also being removed. The result is shown in FIG. 15(F). This now involves a multi-layer body 100k which has a carrier layer 1, a functional layer 2, a replication layer 3, in the first region C a partially shaped functional layer in the form of the structured red photoresist layer 12' and a further partially shaped layer in the form of the dielectric structured reflection layer R in register relationship with the photoresist layer 12', besides a reflecting surface of silver, formed by the partially shaped first layer 3m in the flat second regions D.

FIG. 15(G) shows a multi-layer body 100k' formed in accordance with a process as shown in FIGS. 15(A) through 15(F), as a plan view thereof. A kinematic design element D exhibiting a pump effect upon being tilted was formed from a plurality of fine lines with a line width of 20 μm in each case. The lines themselves correspond to the first regions C with a relief structure while the regions between the lines correspond to the second regions D without a relief structure. Accordingly the lines exhibit the kinematic effect by virtue of the relief structure and the dielectric layer R and are also backed with a red color by virtue of the photoresist layer 12'. Reflecting silver surfaces are disposed therebeside in the region D.

Figure 16:
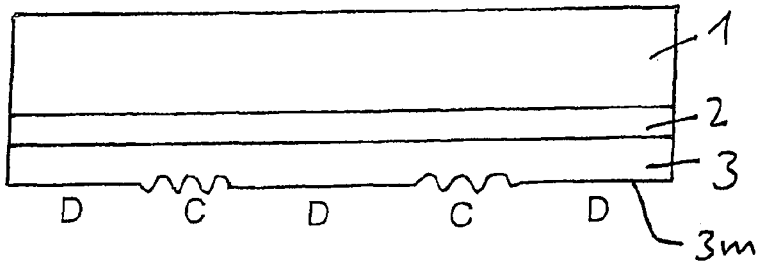
Figure 16:
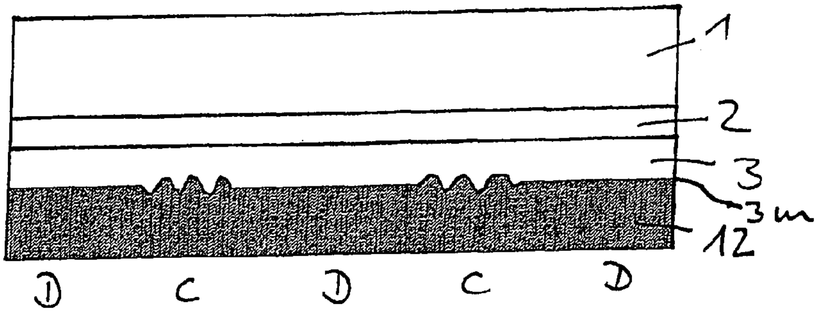
Figure 16:
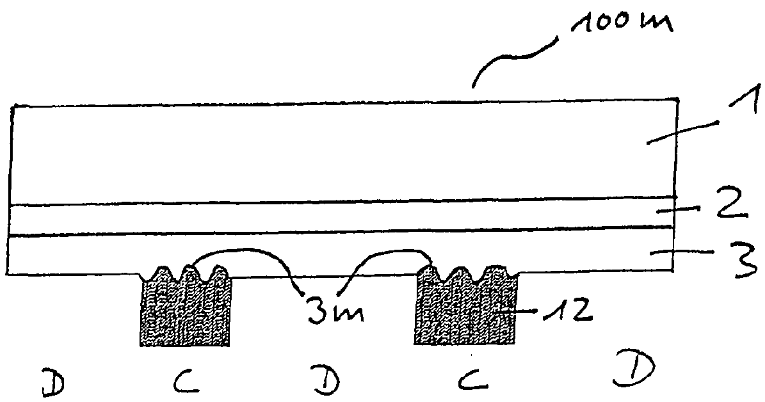

FIGS. 16(A) through (C) show a sectional view of a further embodiment for the first process. FIG. 16(A) shows a carrier layer 1 of PET, a functional layer 2 and a replication layer 3 in which a relief structure was embossed in the first regions C. There is no relief structure in the second regions D, the replication layer 3 is flat here. A first layer 3m of gold is applied thereto by sputtering over the full surface area and as an opaque layer, in which case a higher level of transmission for UV radiation is afforded in the first regions C than in the regions D.

Referring to FIG. 16(B), an opaquely blue-colored negative photoresist layer 12 is applied thereto over the full surface area and same is exposed through the carrier layer 1. The unexposed or less exposed regions of the photoresist layer 12 are removed, with the first layer 3m being exposed in the regions D. The first layer 3m can now be removed in the regions D by etching from the replication layer 3.

The result is shown in FIG. 16(C). This involves a multi-layer body 100m which has a carrier layer 1, a functional layer 2, a replication layer 3, a partially shaped functional layer in the form of a blue photoresist layer 12 and in perfect register relationship therewith a further partially shaped layer in the form of the first layer 3m of gold. If the multi-layer body 100m is viewed from the side of the carrier layer 1, a golden line pattern is presented in the first region C, superposed with a diffractive relief structure producing an optically variable effect, in particular a holographic effect. Viewed from the other side the multi-layer body 100m exhibits a completely different appearance. Thus, the viewing person, from the side of the photoresist layer 12, only sees a filigree opaque blue line pattern in the regions C. The golden line pattern is thus perfectly covered and is accordingly invisible. The multi-layer body 100m is transparent in the regions D.

Figure 17A:
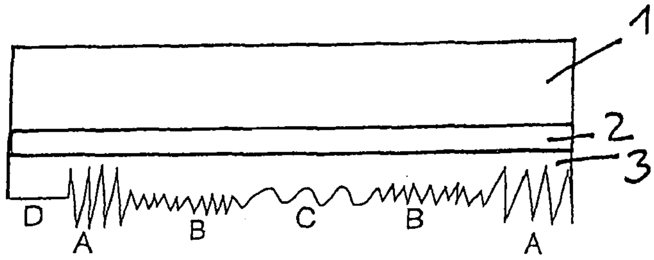
FIGS. 17(A) through 17(H) show further diagrammatic sectional views relating to the first process.

FIGS. 17(A) through 17(H) show sectional views illustrating the implementation of a complex first process. FIG. 17(A) shows a carrier layer 1, a functional layer 2 and a replication layer 3 into which three different relief structures were embossed. A first relief structure was formed in the regions A, a second relief structure was formed in the regions B and a third kinematic relief structure was formed in the regions C, while no relief structure was produced in the region D. The first and second relief structures are high-frequency grating structures involving different aspect ratios.

Figure 17B:
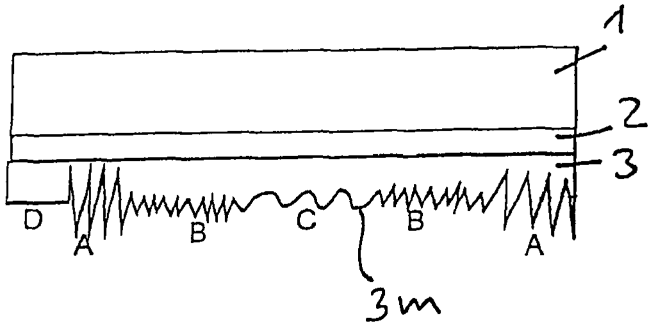

A first layer 3m of aluminum was subsequently sputtered opaquely over the full surface area to the replication layer 3 as shown in FIG. 17(B), in which case the regions A involve a higher level of transmission for UV radiation than the regions B, the regions B involve a higher level of transmission for UV radiation than the regions C and the regions C involve a higher level of transmission for UV radiation than the regions D.

Figure 17C:
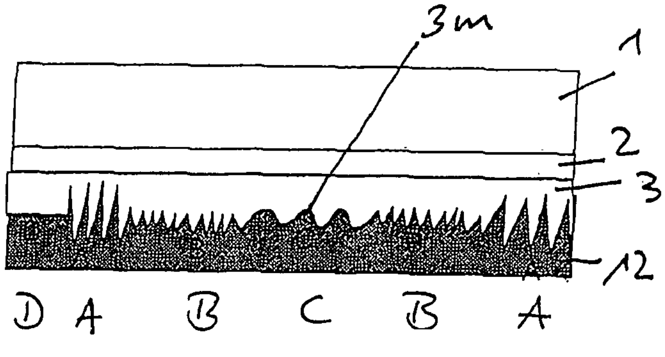
Figure 17:
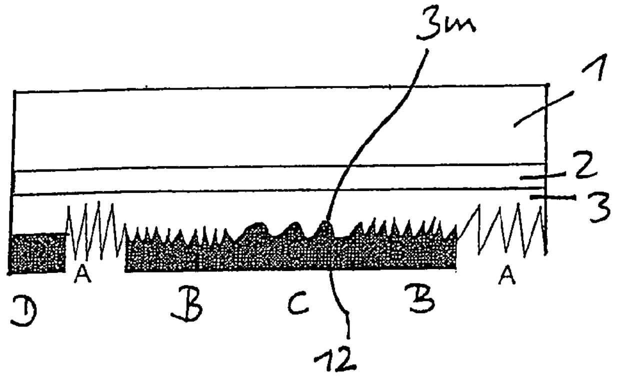
Figure 17:
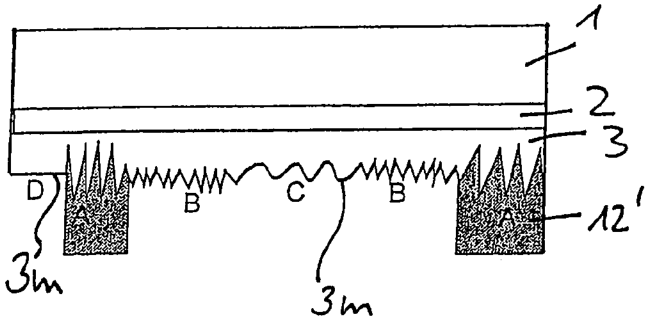
Figure 17:
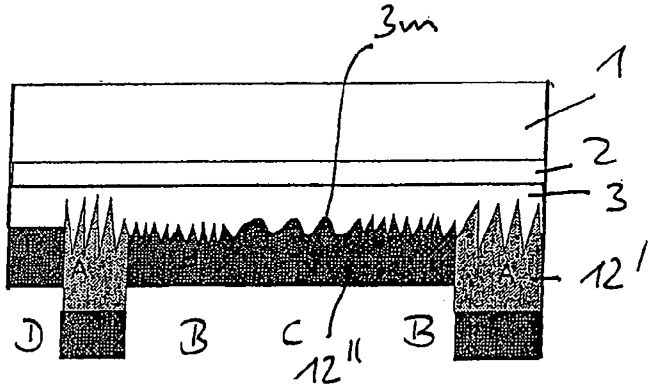

A positive photoresist layer 12 was applied thereto over the full surface area as shown in FIG. 17(C) and exposed through the first layer 3m, in which case the regions A with the first relief structure were most greatly exposed and can thereafter be removed.

FIG. 17(D) shows the photoresist layer 12 after structuring thereof and after removal of the first layer 3m in the regions A by etching, with the structured photoresist 12 serving as an etching mask. The first layer 3m is therefore only still to be found in the regions B, C and D.

The positive photoresist 12 is now removed, a blue-colored negative photoresist layer 12' is applied over the full surface area and exposed through the carrier layer 1. In the less exposed regions B, C and D, the negative photoresist layer 12' can subsequently be removed, while hardening is effected in the regions A. FIG. 17(E) shows the layer structure at that stage after structuring of the negative photoresist layer 12'.

Referring to FIG. 17(F), a further positive photoresist layer 12" is thereupon produced over the full surface area and exposed through the carrier layer 1.

Figure 17G:
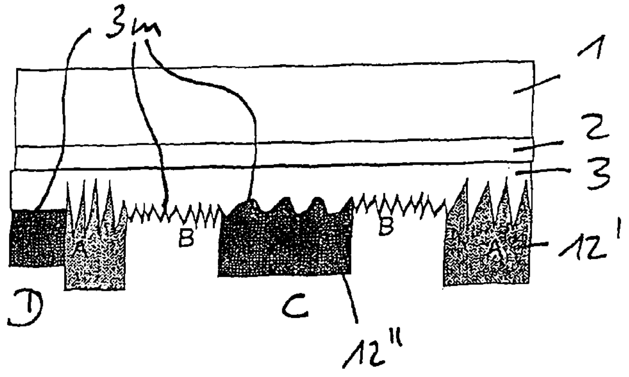
Figure 17:
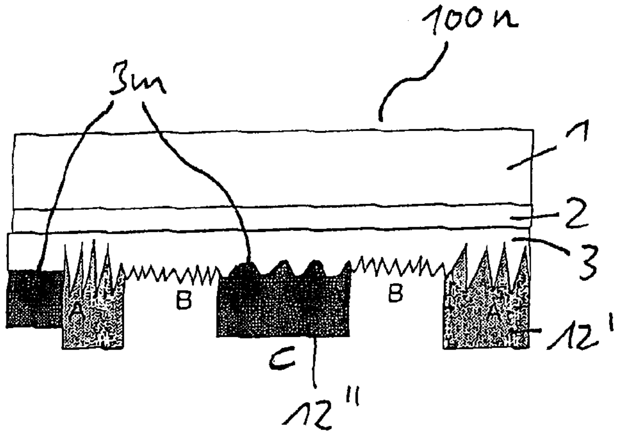

The further positive photoresist layer 12" is thereupon removed in the regions B. The result is shown in FIG. 17(G).

The exposed first layer 3*m* is now removed by etching in the regions B. The result is shown in FIG. 17(H). This involves a multi-layer body 100*n* having a carrier layer 1, a functional layer 2, a replication layer 3, a partially shaped blue functional layer in the form of the negative photoresist layer 12', a further partially shaped layer in the form of the first layer 3*m* which acts on the one hand as a mirror surface in the regions D and which on the other hand is superposed with the kinematic effect in the region C.

The further positive photoresist layer 12" is optionally removed and an adhesive layer applied over the full surface area involved. If a colored positive photoresist layer 12" is used it can however also remain on the multi-layer body.

Figure 18:
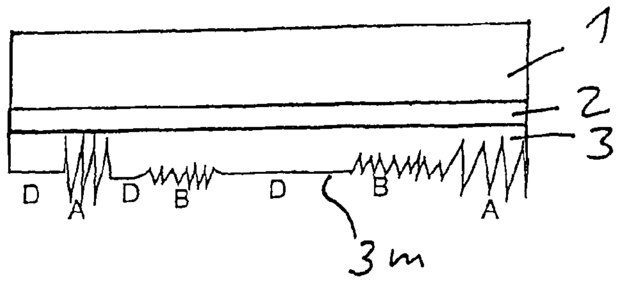
FIGS. 18(A) through 18(H) show further diagrammatic sectional views relating to the first process.
FIG. 18(K) shows a plan view of a first multi-layer body formed in accordance with the process of FIGS. 18(A) through (H)
FIG. 18(M) shows a plan view of a second multi-layer body formed in accordance with the process of FIGS. 18(A) through (H)
Figure 18:
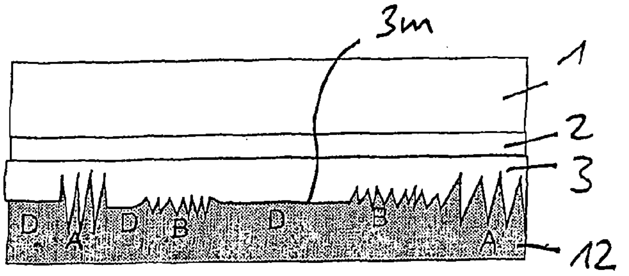
Figure 18:
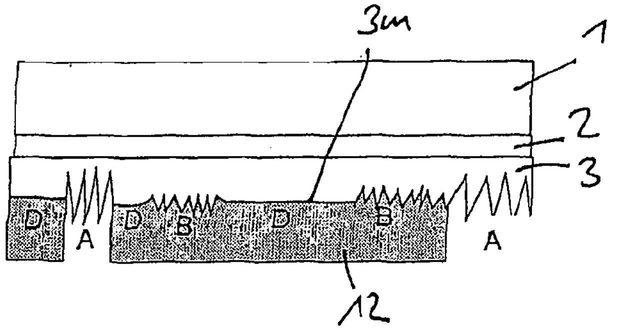
Figure 18:
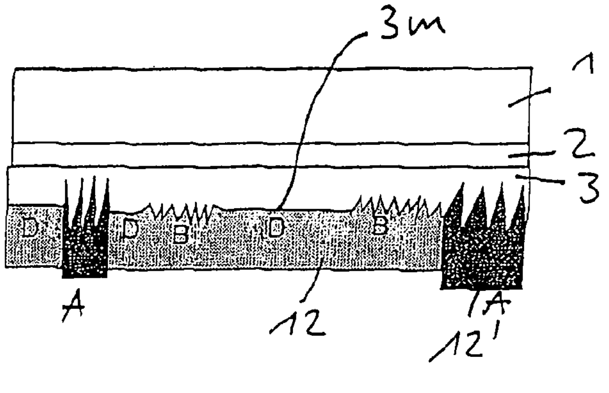
Figure 18:
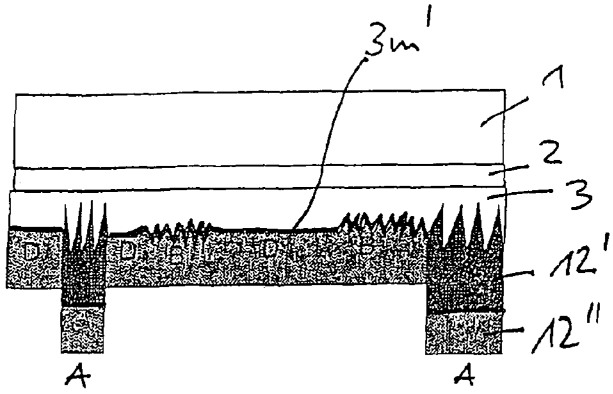
Figure 18:
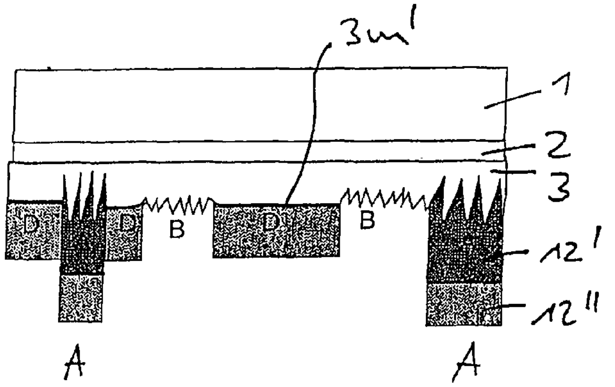
Figure 18:
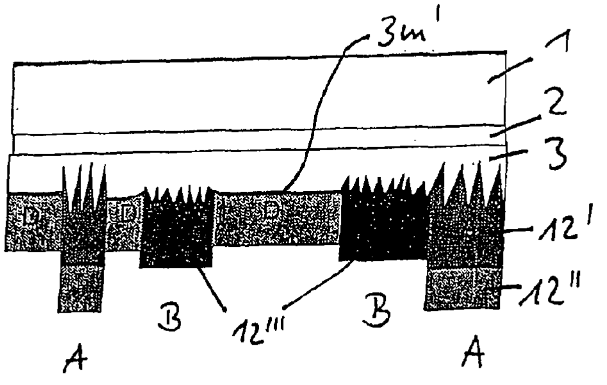
Figure 18:
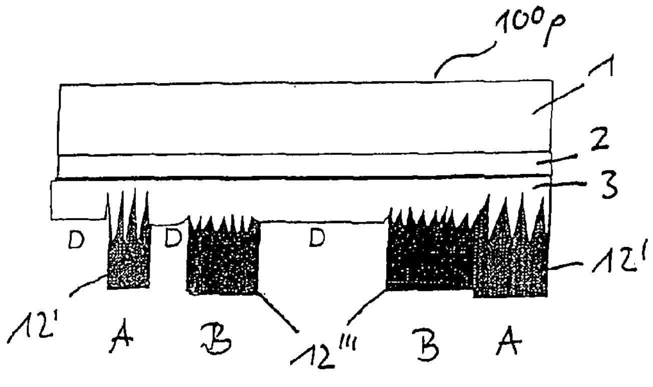

FIGS. 18(A) through 18(H) diagrammatically show sectional views of a further first process for the production of a filigree printed pattern comprising two different inks or colors in perfect register relationship with each other. FIG. 18(A) shows a carrier layer 1, a functional layer 2 and a replication layer 3 in which two different relief structures were embossed. Thus a first relief structure was formed in the regions A, a second relief structure formed in the regions B while no relief structure was formed in the region D. The first and second relief structures are high-frequency grating structures involving different aspect ratios. A first layer 3*m* of aluminum is applied to the replication layer 3 by sputtering opaquely and over the full surface area, in which case the regions A involve a higher level of transmission for UV radiation than the regions B and the regions B involve a higher degree of transmission for UV radiation than the regions D.

Referring to FIG. 18(B) a positive photoresist layer 12 was applied thereto over the full surface area and exposed through the carrier layer 1 and the first layer 3*m*, in which case the regions A with the first relief structure are most greatly exposed and thereafter can be removed in specifically targeted fashion. The partially shaped positive photoresist layer 12 is now used as an etching mask and the exposed regions A of the first layer 3*m* are removed by etching. The result is shown in FIG. 18(C).

A blue-colored negative photoresist layer 12' is now applied over the full surface area and exposed through the carrier layer, hardening occurring in the regions A. The negative photoresist layer 12' is removed in the regions B and D. The result is shown in FIG. 18(D).

The positive photoresist layer 12 is now completely removed and the first layer 3*m* also completely removed by etching.

Thereupon a further first layer 3*m'* of aluminum is applied by sputtering over the full surface area and a further positive photoresist layer 12" is applied over the full surface area. The result is shown in FIG. 18(E). That is followed by exposure of the further positive photoresist layer 12" through the carrier layer 1, and then removal of the further positive photoresist layer 12" in the most greatly exposed regions B. After the negative photoresist layer 12' fills the first relief structure in the region A transmission through the further first layer 3*m'* in the region A is now equivalent to that in the region D and both region A and also D of the positive photoresist layer 12" are retained. The further first layer 3*m'* is exposed in the regions B and removed by etching, see FIG. 18(F).

A red-colored further negative photoresist layer 12'" is now applied over the full surface area and exposed through the carrier layer 1, hardening occurring in the regions B. In the other regions the red-colored further negative photoresist layer 12'" is removed. The result is shown in FIG. 18(G).

Finally the further positive photoresist layer 12" is removed and the further first metal layer 3*m'* completely dissolved away by etching. The result is shown in FIG. 18(H) where a multi-layer body 100*p* is produced with a carrier layer 1, a functional layer 2, a partially shaped functional layer in the form of the blue negative photoresist layer 12' and a further partially shaped layer in the form of the further red negative photoresist layer 12'". The red and blue layers 12', 12'" are positioned in perfect register relationship with each other.

Figure 18K:
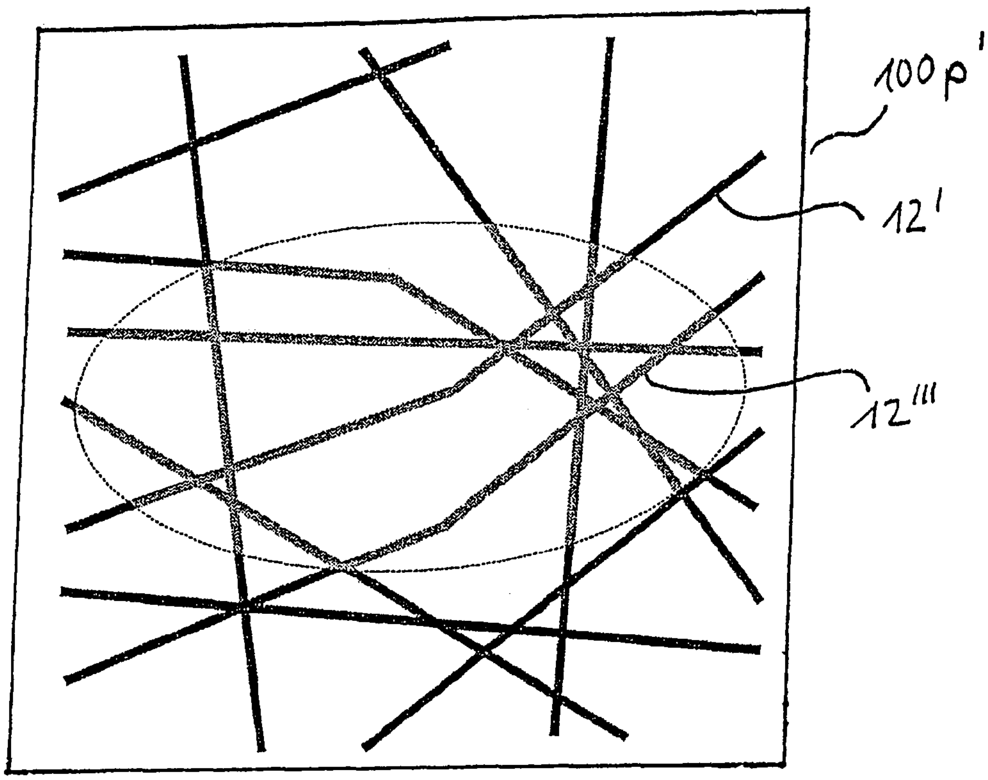
Figure 18:
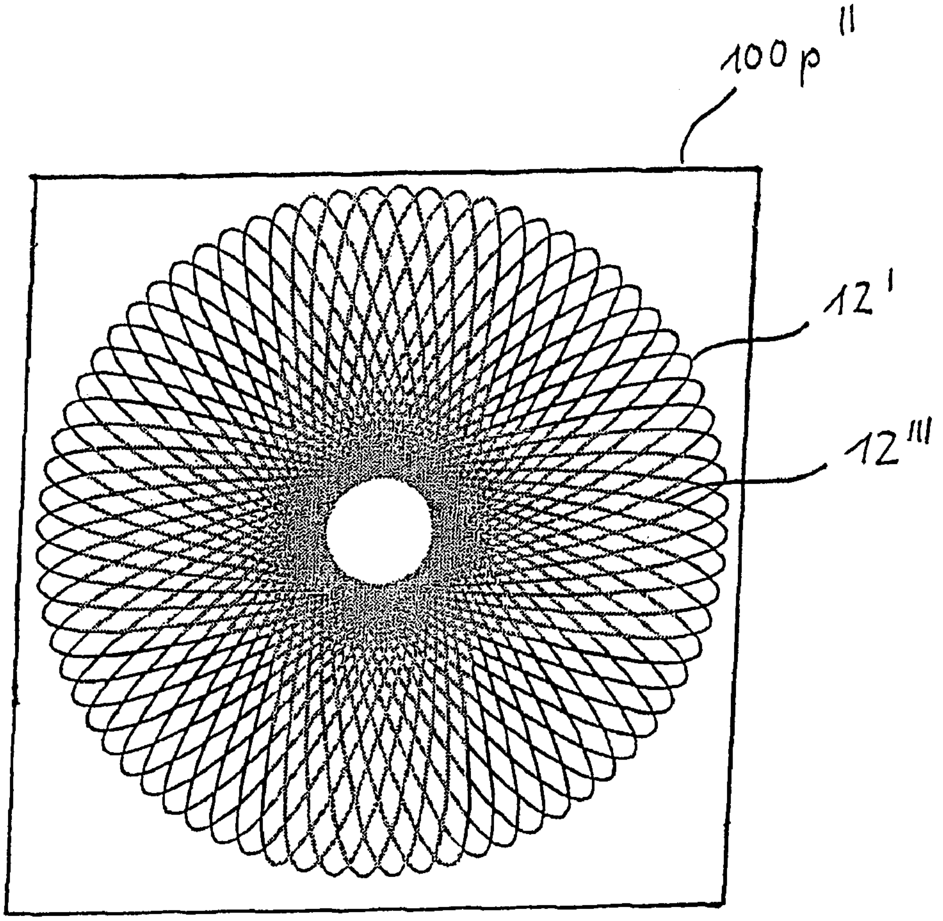

FIG. 18(K) shows a plan view of a multi-layer body 100*p'* formed by a process as shown in FIGS. 18(A) through (H). It is possible to see blue lines, formed from the negative photoresist layer 12', and red lines, formed from the further photoresist layer 12'", which jointly form a colored filigree security design element against a transparent background. An elliptical region is indicated by means of a dotted line showing the extent of the red lines. At all the locations at which the virtual dotted line intersects a colored line of the design element, the color changes from red to blue, the line being continued straight without any deviation. Design elements of that kind are extremely difficult to imitate. An arrangement of different colors along a line, in accurate register relationship in that fashion, has hitherto not been achieved with known processes. Design elements produced by the processes according to the invention however can equally have mutually juxtaposed color lines or color lines engaging into each other.

FIG. 18(M) shows a plan view of a further multi-layer body 100*p"* formed by a process as shown in FIGS. 18(A) through (H). It is possible to see blue lines, formed from the negative photoresist layer 12', and red lines formed from the further photoresist layer 12'", which jointly form a colored round security design element against a transparent background. The extent of the red lines presents a cross shape. At all the locations on the periphery of the cross the color changes directly from red to blue within the configuration of the line, the line being continued without any displacement. Such design elements are also extremely difficult to imitate. As an alternative thereto such a security design element, instead of the blue lines, can be formed with a reflecting metal layer, instead of the red lines, it can be formed with a luminescent layer or liquid crystal layer, and so forth, and much more besides. At the same time a different color impression can be produced from the front and rear sides of the multi-layer body at such a security element.

Figure 19:
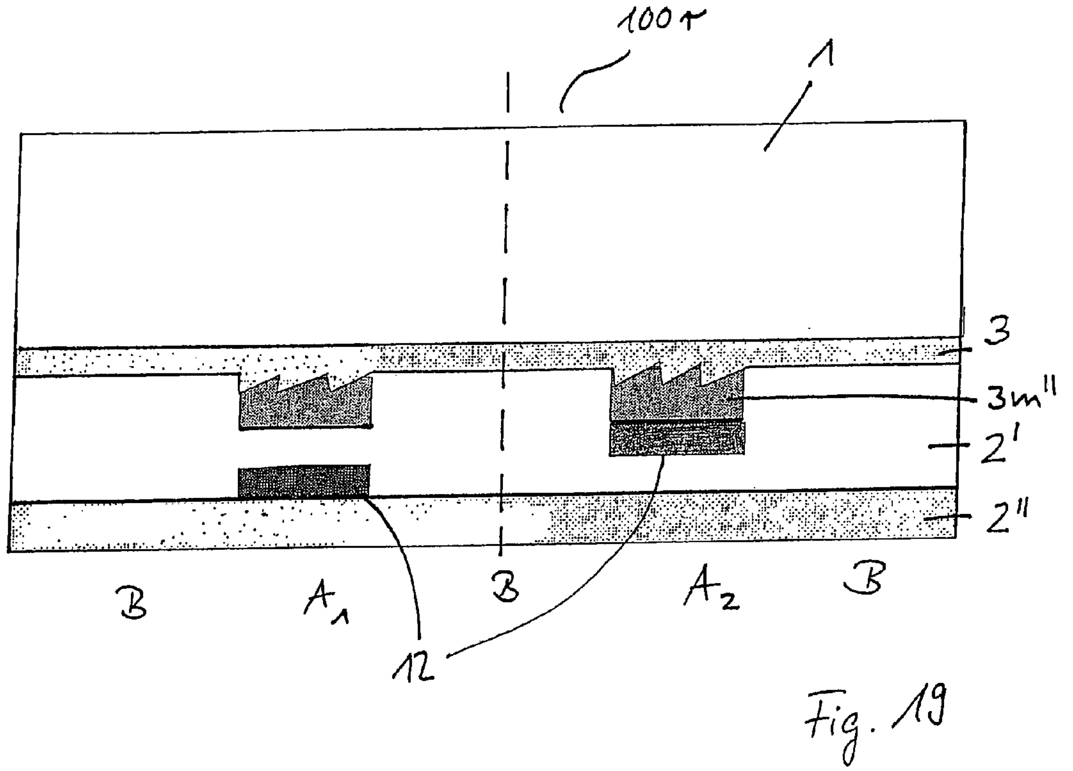
FIG. 19 shows a diagrammatic sectional view through a further multi-layer body.

FIG. 19 shows a further sectional view through a multi-layer body 100*r* according to the invention. There is a carrier layer 1 and a replication layer 3 in which a first relief structure is formed in first regions A. In contrast there is no relief structure in the second regions B. A green printing ink was raked into the first relief structure, forming a structured first layer 3*m"* which here is illustrated in exaggerated thickness. It is now possible to further proceed in two ways.

If a structure as in the left region $A_1$ is to be produced, a transparent spacer layer 2' is formed and a red-colored positive photoresist layer 12 is applied thereto over the full surface area involved. The photoresist layer 12 is exposed through the carrier layer 1 and the first layer 3*m"* functioning as an exposure mask. The photoresist layer 12 is then removed in the regions B. That gives a partially shaped functional layer in the form of the green printing ink which is exactly backed with a further partially shaped layer in the form of the red structured photoresist layer 12. In addition, optical superpositioning effects such as viewing angle-dependent moiré effects or local shadowing effects are produced by virtue of the spacer layer 2'.

If a structure as in the right-hand region $A_2$ is to be produced, a red-colored positive photoresist layer 12 is applied over the full surface area involved. The photoresist layer 12 is exposed through the carrier layer 1 and the first layer 3*m*" functioning as an exposure mask. The photoresist layer 12 is then removed in the regions B. The result is a partially shaped functional layer in the form of the green printing ink which is exactly backed with a further partially shaped layer in the form of the red structured photoresist layer 12.

Finally it is also possible to provide an adhesive layer 2".

Figure 20:
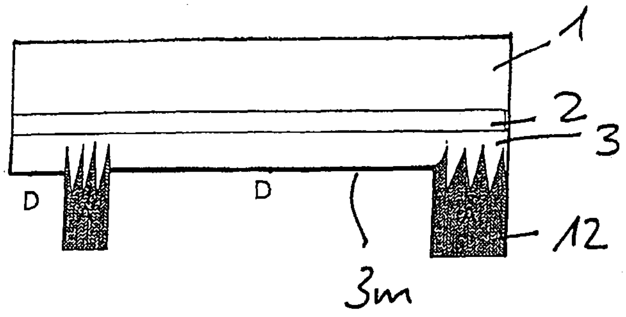
FIGS. 20(A) through 20(C) show further diagrammatic sectional views relating to the first process.
Figure 20:
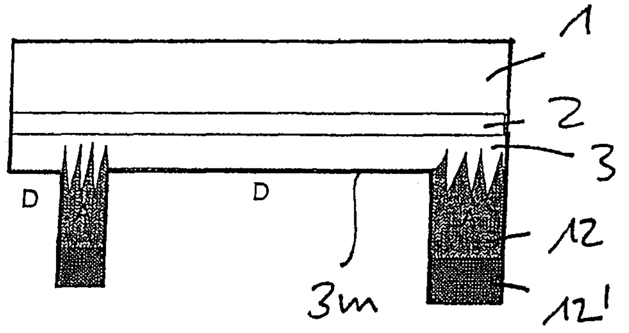
Figure 20:
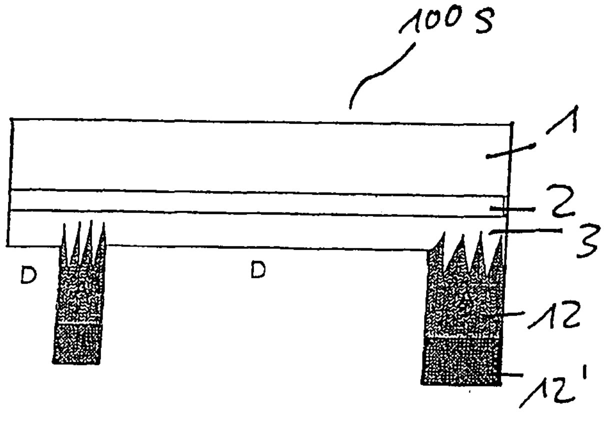

FIGS. 20(A) through 20(C) diagrammatically show sectional views of a further first process. In this case, as shown in FIG. 20(A), there is provided a carrier layer 1, a functional layer 2 and a replication layer 3 in which a relief structure is produced in first regions A while second regions D remain flat. A first layer 3*m* of aluminum is then applied thereto by sputtering over the full surface area, the layer 3*m* being transparent in the regions A and already opaque in the regions D.

A yellow-colored transparent negative photoresist layer 12 is then applied thereto over the full surface area and exposed through the carrier layer 1. The unexposed regions of the photoresist layer 12, that is to say in the regions D, are then removed and the first layer 3*m* exposed there.

A further opaquely blue-colored negative photoresist layer 12' is then applied over the full surface area and exposed through the carrier layer 1. The unexposed regions of the further photoresist layer 12', that is to say in the regions D, are then removed and the first layer 3*m* exposed there. The result is shown in FIG. 20(B).

Then the first layer 3*m* is removed by etching in the regions D, the two photoresist layers 12, 12' serving as an etching mask. The result is shown in FIG. 20(C). The multi-layer body 100*s* has a carrier layer 1, a functional layer 2, a replication layer 3, a yellow photoresist layer 12 as a partially shaped functional layer and in perfect register relationship therewith a blue photoresist layer 12' as a further partially shaped layer against a transparent background. The transparent first layer 3*m* which is still present in the regions A permits the relief structure to be recognized, without itself deploying a color effect, when the multi-layer body 100*s* is viewed from the side of the carrier layer 1.

Figure 21:
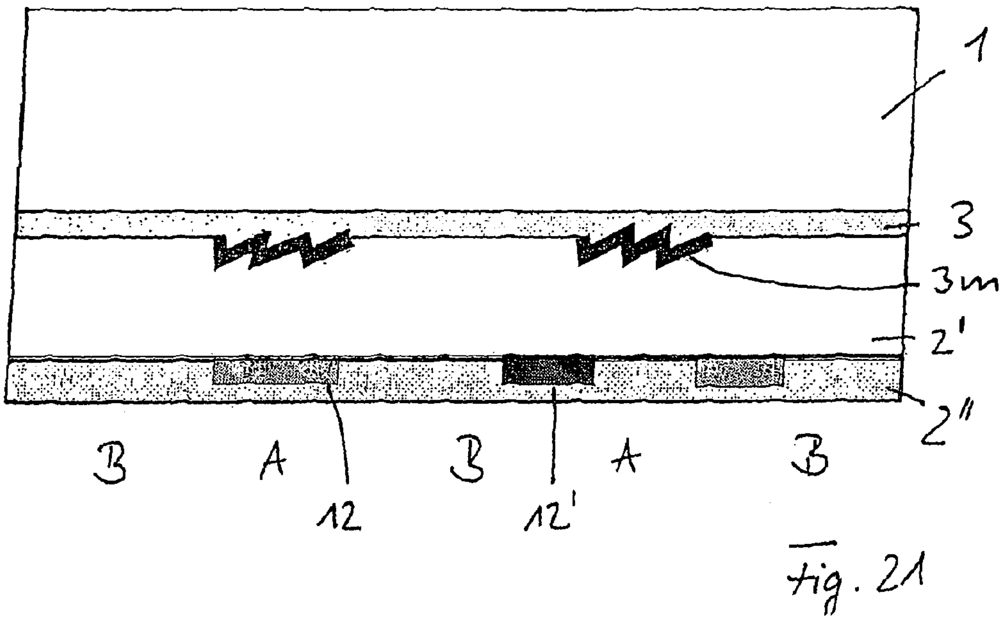
FIG. 21 shows a sectional view of a multi-layer body formed in accordance with the first process.
Figure 22:
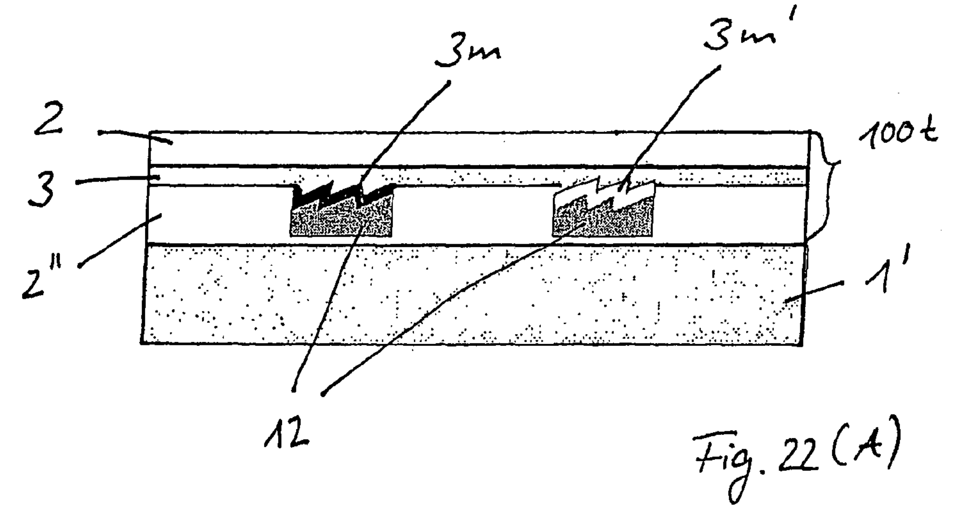
Figure 22:
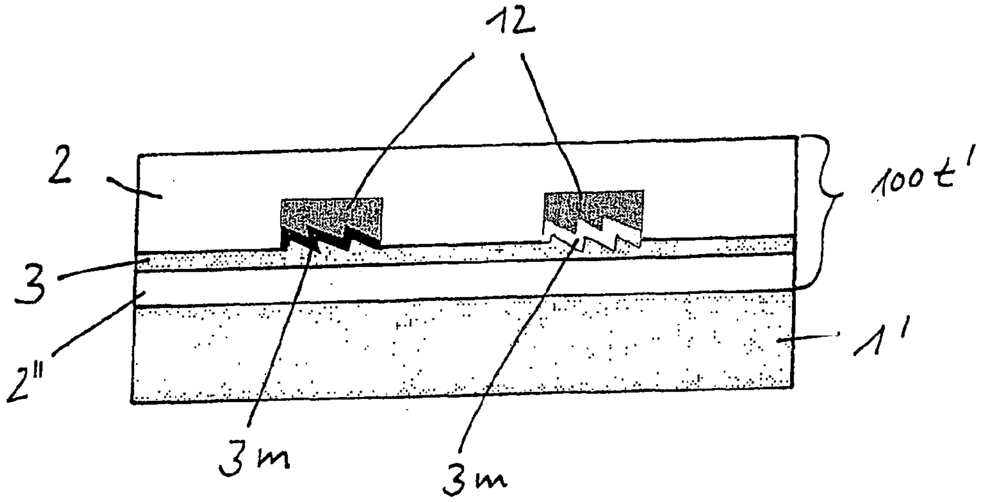
Figure 23:
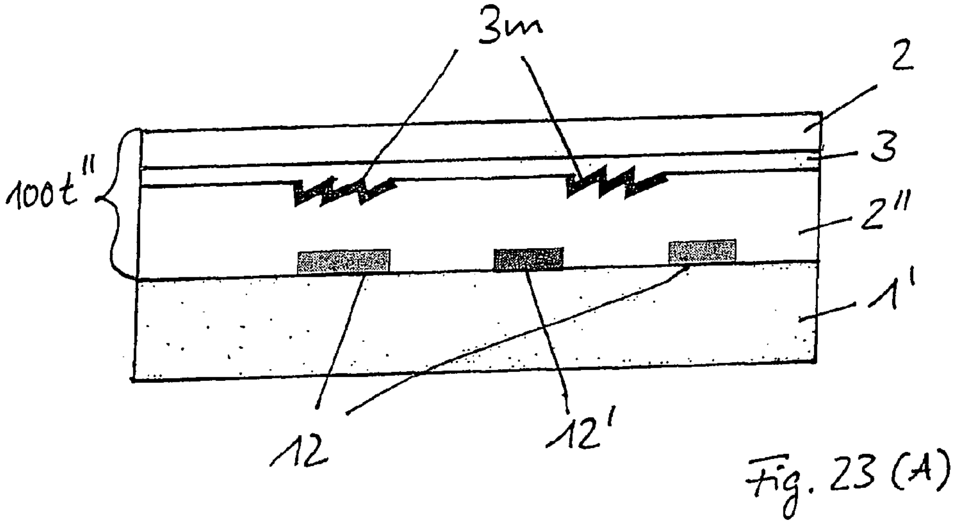
Figure 23:
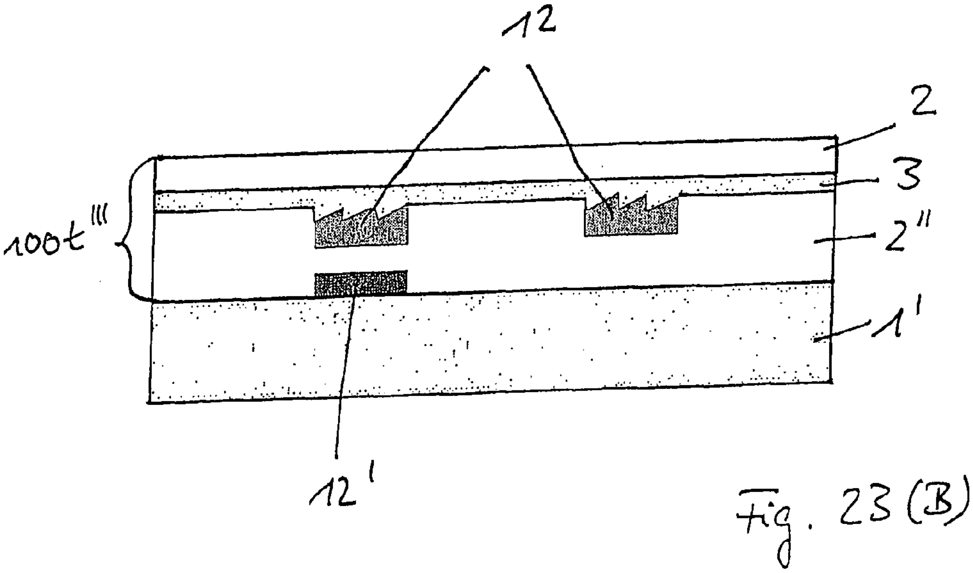

FIG. 21 shows a further multi-layer body according to the invention which was formed in accordance with the first process, comprising a carrier layer 1, a replication layer 3, a structured first layer 3*m* of aluminum, a transparent spacer layer 2' and two differently colored photoresist layers 12, 12'. In this case orientation of the photoresist layers 12, 12' is effected in dependence on the first layer directly beneath the first layer 3*m* or in displaced relationship therewith, whereby an inclined displacement can also be produced in specifically targeted fashion, as can be seen for the photoresist layer 12', by virtue of inclined exposure through the first layer 3*m*. Finally there is a transparent adhesive layer 2".

FIGS. 22(A) through 23(B) show sectional views of security documents produced in accordance with the first process.

FIG. 22(A) shows a transparent identity card 1' on which a transparent multi-layer body 100*t* is stuck by means of the adhesive layer 2". There is a transparent protective lacquer layer in the form of a functional layer 2, a replication layer 3 of transparent lacquer with a first relief structure, a partially shaped first layer 3*m* in the form of an opaque aluminum layer, a further partially shaped layer in the form of a transparent dielectric reflection layer of ZnS and a partially shaped functional layer 12 in the form of an opaque green printing ink. The functional layer 12 is shaped in perfect register relationship with the further partially shaped layers 3*m*, 3*m*' and the first relief structure in the replication layer 3. Accordingly a holographic representation in line form is presented to the viewing person by the functional layer 2, the holographic representation on the one hand being backed with fine aluminum lines and on the other hand with a transparent ZnS layer and green color. Viewed from the other side only a filigree green printed image consisting of fine lines presents itself to the viewer through the identity card 1'.

FIG. 22(B) shows a transparent identity card 1' on which a transparent multi-layer body loot has been stuck by means of the adhesive layer 2". There is a transparent protective lacquer layer in the form of a functional layer 2, a replication layer 3 of transparent lacquer with a first relief structure, a partially shaped first layer 3*m* in the form of an opaque aluminum layer, a further partially shaped layer in the form of a transparent dielectric reflection layer of ZnS and a partially shaped functional layer 12 in the form of an opaque green printing ink. The functional layer 12 is shaped in perfect register relationship with the further partially shaped layers 3*m*, 3*m*' and with the first relief structure in the replication layer 3. Accordingly a filigree green printed image consisting of fine lines presents itself to the viewer through the functional layer 2. Viewed from the other side a holographic representation in line form presents itself to the viewer through the identity card 1', the holographic representation being backed on the one hand with fine aluminum lines and on the other hand with a transparent ZnS layer and green color.

FIG. 23(A) shows a transparent identity card 1' on which a transparent multi-layer body 100*t*" was stuck by means of a transparent adhesive layer 2". There is a transparent protective lacquer layer in the form of a functional layer 2, a replication layer 3 of transparent lacquer with a first relief structure, a partially shaped first layer 3*m* in the form of an opaque aluminum layer, the adhesive layer 2" which here functions as a spacer layer, a further partially shaped layer in the form of a transparent red photoresist layer 12 and a partially shaped functional layer 12' in the form of an opaque green printing ink. The red photoresist layer 12, viewed perpendicularly to the plane of the identity card 1', is arranged in part in coincident relationship with the partially shaped first layer 3*m* and partially displaced with respect thereto. The partially shaped functional layer 12' is shaped in displaced relationship with the first layer 3*m*. Therefore, a filigree decorative image comprising fine green, red and metallic lines is presented to the viewer through the functional layer 2, wherein the metallic lines, by virtue of the first relief structure, exhibit a holographic effect. Viewed from the other side, a filigree decorative image of fine green, red and metallic lines is also presented to the viewer through the identity card 1', the metallic lines, by virtue of the first relief structure, exhibiting a holographic effect. It will be noted however that some of the metallic lines are superposed by the transparent red photoresist layer 12. If the multi-layer body 100*t*" is detached from the identity card 1' by a forger in order to manipulate personally related data on the surface of the identity card 1', the red and green layers 12, 12' remain on the identity card 1' while the other layers 2", 3*m*, 3, 2 can be detached. After manipulation of the data the detached layer stack has to be applied to the identity card 1' again so as to give the filigree decorative image. By virtue of the fine lines however that is almost hopeless and deviations from the original position remain discernible. The identity card 1' is particularly effectively protected from attempts at forgery by the multi-layer body 100*t"*.

FIG. 23(B) shows a transparent identity card 1' on which a transparent multi-layer body 100*t'"* was stuck by means of a transparent adhesive layer 2". There is a transparent protective lacquer layer in the form of a functional layer 2, a replication layer 3 of transparent lacquer with a first relief structure, a partially shaped first layer 3*m* as a functional layer in the form of a transparent red photoresist layer 12, the adhesive layer 2" which functions as a spacer layer and a further partially shaped layer in the form of an opaque green photoresist layer 12'. The red photoresist layer 12, viewed perpendicularly to the plane of the identity card 1', is in coincident relationship with the first relief structure and is arranged region-wise in coincident relationship with the partially shaped green photoresist layer 12'. Therefore a filigree decorative image consisting of fine transparent red and opaque black lines is presented to the viewer through the functional layer 2. Seen from the other side a filigree decorative image consisting of fine opaque green and transparent red lines presents itself to the viewer through the identity card 1'. If the multi-layer body 100*t'"* is detached from the identity card 1' by a forger in order to manipulate personally related data on the surface of the identity card 1', the green layer 12' remains on the identity card 1' while the other layers 2", 12, 3, 2 can be detached. After manipulation of the data the detached layer stack has to be applied to the identity card 1' again in such a way as to give the filigree decorative image. By virtue of the fine lines however that is almost hopeless and deviations from the original position still remain discernible. The identity card 1' is also particularly effectively protected from attempts at forgery by the multi-layer body 100*t'"*.

FIGS. 24(A) through (E) diagrammatically show views in section of a second process for the production of a filigree printed pattern comprising two different colors in perfect register relationship with each other.

Figure 24:
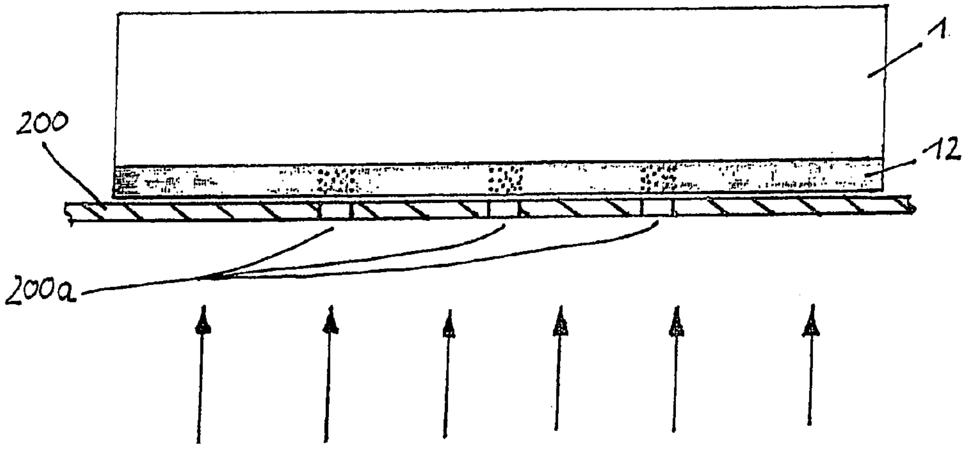
FIGS. 24(A) through (E) show diagrammatic sectional views relating to the second process.
Figure 24:
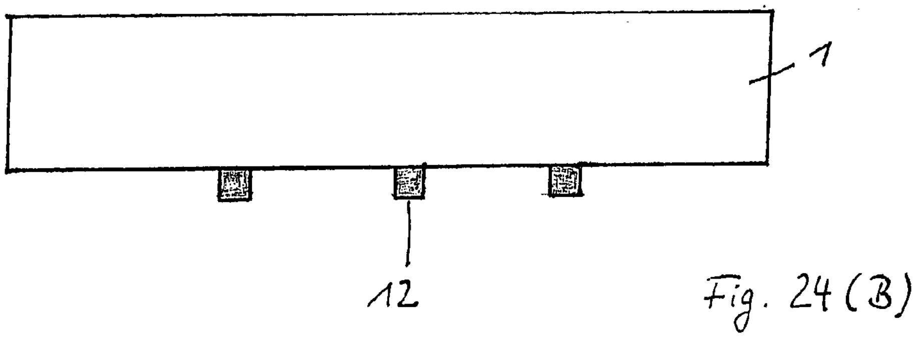
Figure 24:
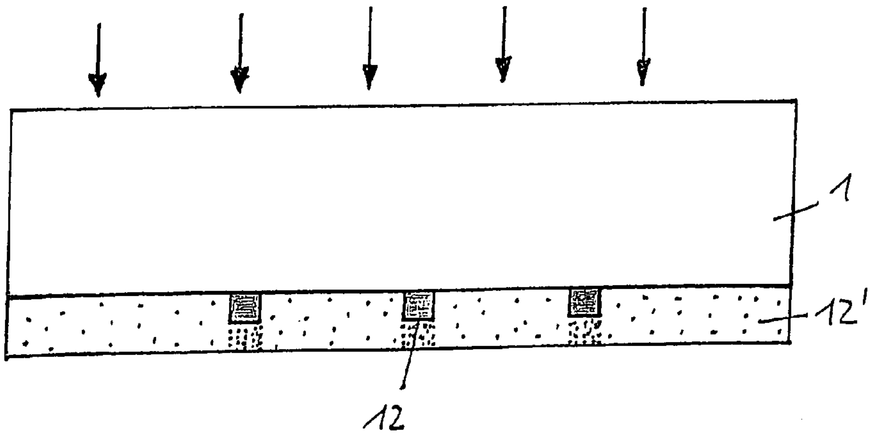
Figure 24:
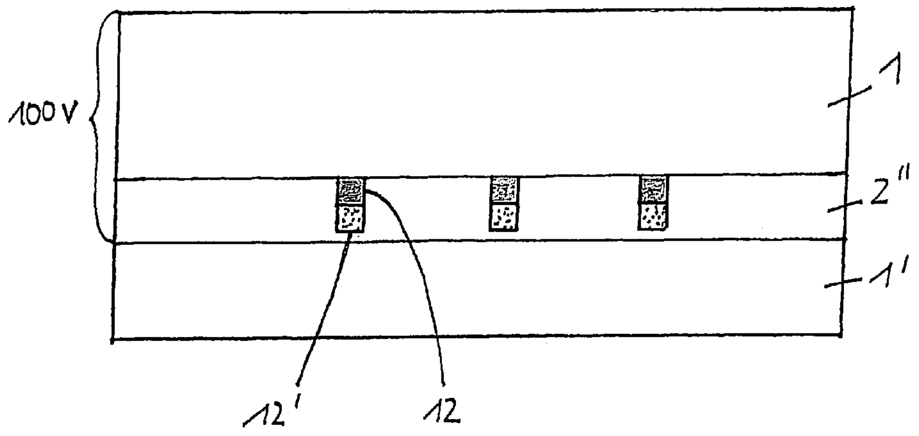
Figure 24:
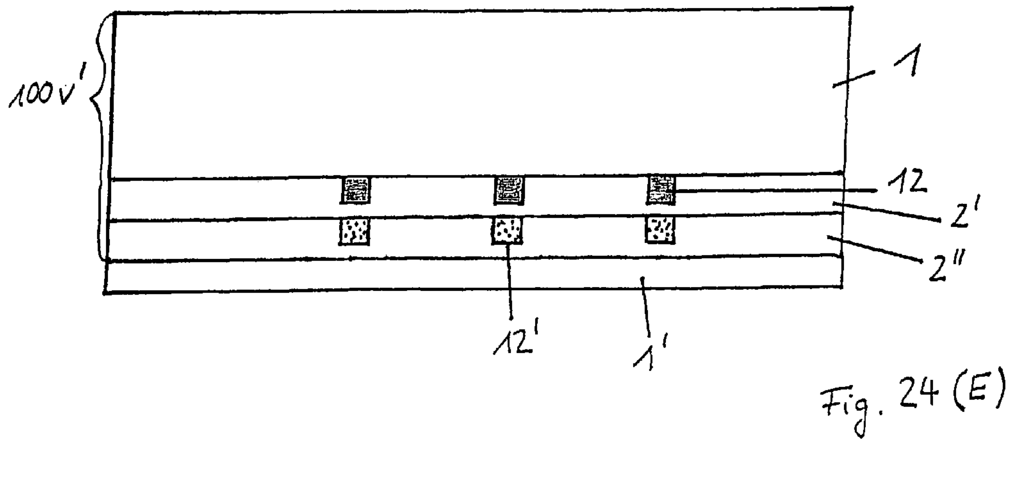

FIG. 24(A) shows a transparent carrier layer 1 of PET, on one side of which a red-colored negative photoresist layer 12 has been applied over the full surface area. The negative photoresist layer 12 is then exposed in pattern form by way of a mask 200 having radiation-transmitting openings 200*a* (the arrows show the direction of radiation). After removal of the mask the unexposed regions, of the photoresist layer 12 are removed while the exposed regions remain on the carrier layer 1 and form a red line pattern. The result is shown in FIG. 24(B).

Now the procedure either involves applying a transparent lacquer layer as a spacer layer and then a green-colored positive photoresist layer 12' or however, as shown in FIG. 24(C), directly a green-colored positive photoresist layer 12'. The positive photoresist layer 12' is exposed through the carrier layer 1 and the partially shaped red photoresist layer 12 functioning as a mask layer (the arrows show the direction of the radiation).

Now the exposed regions of the green photoresist layer 12' are removed while the unexposed regions remain on the partially shaped red photoresist layer 12. Finally an adhesive layer 2 is applied over the full surface area involved.

FIG. 24(D) shows a security document which is formed with a multi-layer body produced in that way and in which the multi-layer body 100*v* formed is shown stuck on a transparent identity card 1'. The multi-layer body 100*v* includes the transparent carrier layer 1, the red photoresist layer 12 functioning as a partially shaped functional layer, in perfect register relationship therewith the green photoresist layer 12' in the form of a further partially shaped layer, and a transparent adhesive layer 2". The security document, seen from the carrier layer 1, presents a filigree red line pattern to a viewer while seen from the identity card 1', it presents a filigree green line pattern.

FIG. 24(E) shows a security document which is formed with the multi-layer body formed inclusive of the spacer layer and in which the multi-layer body 100*v'* formed is shown stuck on a transparent identity card 1'. The multi-layer body 100*v'* includes the transparent carrier layer 1, the red photoresist layer 12 functioning as a partially shaped functional layer, the transparent spacer layer 2' and in perfect register relationship with the red photoresist layer 12 the green photoresist layer 12' which is in the form of a further partially shaped layer, and a transparent adhesive layer 2". The security document, viewed from the carrier layer 1, presents to a viewer a filigree red line pattern and, viewed from the identity card 1', a filigree green line pattern, wherein depending on the respective thickness of the spacer layer 2', when the security document is tilted, the respective other color and/or optical superpositioning effects are exhibited.

It will be appreciated that, with the whole host of possible process procedures and multi-layer bodies and security documents or components which can be formed, it is not possible for them all to be set out exhaustively. The man skilled in the art however, with knowledge of the invention, is readily in a position to modify or combine the process steps to arrive at the desired result. Thus the man skilled in the art can also readily combine the first process according to the invention with the second process according to the invention to achieve further embodiments, in particular decorative effects with filigree line patterns, with at the same time a high level of safeguard against imitation.

The invention claimed is:

1. A process for the production of a multi-layer body having at least one partially shaped functional layer in register relationship with at least one further partially shaped layer, wherein a first layer in the form of a first photoresist lacquer layer is formed on a carrier layer and partially exposed, the exposed first layer is developed and structured and then using the structured first layer as a mask layer the at least one partially shaped functional layer and/or the at least one further partially shaped layer is formed.

2. A process as set forth in claim 1, wherein the at least one partially shaped functional layer or the at least further partially shaped layer is formed by a procedure whereby a second positive or negative photoresist lacquer layer mixed with coloring agent is applied, the second photoresist lacquer layer is exposed through the structured first layer and structuring of the exposed second photoresist lacquer layer is effected.

3. A process as set forth in claim 1, wherein the first and/or the second photoresist lacquer layer forms the at least one partially shaped functional layer.

4. A process as set forth in claim 1, wherein subsequently the carrier layer is produced partially by diffusion therein of a coloring agent in the form of a partially shaped functional layer or further layer, wherein at least the first and/or second structured photoresist lacquer layer functions as a diffusion barrier.

5. A process as set forth in claim 1, wherein a material is raked into exposed regions of the carrier layer, which viewed perpendicularly to the plane of the carrier layer are surrounded by a partially shaped functional layer or further partially shaped layer, and at least one further partially shaped functional layer or further partially shaped layer is formed.

6. A process as set forth in claim 1, wherein the at least one partially shaped functional layer is in the form of a lacquer layer or a polymer layer.

7. A process as set forth in claim 1, wherein the at least one partially shaped functional layer is produced with the addition of one or more, non-metallic functional layer materials.

8. A process as set forth in claim 1, wherein the at least one partially shaped functional layer is produced with the addition of one or more multicolored functional layer materials, and/or at least one partially shaped functional layer is in the form of a hydrophobic or hydrophilic layer.

9. A process as set forth in claim 1, wherein the at least one further partially shaped layer is formed by the first layer and/or at least one colored positive or negative photoresist lacquer layer and/or by at least one optically variable layer with an optical effect which differs in dependence on viewing angle and/or by at least one metallic reflection layer and/or by at least one dielectric reflection layer.

10. A process as set forth in claim 9, wherein the optically variable layer is such that it includes at least one substance with an optical effect which is different in dependence on the viewing angle and/or is formed by at least one liquid crystal layer with an optical effect which is different in dependence on the viewing angle and/or by a thin film reflection layer stack with a viewing angle-dependent interference color effect.

11. A process as set forth in claim 1, wherein the structured first layer is at least partially removed and replaced by the at least one partially shaped functional layer and/or the at least one further partially shaped layer.

12. A process as set forth in claim 11, wherein complete removal of the structured first layer is effected.

13. A process as set forth in claim 1, wherein the at least one partially shaped functional layer viewed perpendicularly to the plane of the replication layer or carrier layer is arranged in coincident relationship above or beneath the at least one further partially shaped layer.

14. A process as set forth in claim 1, wherein the at least one partially shaped functional layer viewed perpendicularly to the plane of the replication layer or carrier layer is arranged alternately or with a uniform spacing relative to the at least one further partially shaped layer.

15. A process as set forth in claim 1, wherein at least one first transparent spacer layer is arranged between the at least one partially shaped functional layer and the at least one further partially shaped layer.

16. A process as set forth in claim 1, wherein at least one second transparent spacer layer is arranged between at least two further partially shaped layers.

17. A process as set forth in claim 15, wherein the first and/or the second spacer layer is formed locally in at least two different layer thicknesses.

18. A process as set forth in claim 15, wherein the first and/or the second spacer layer is formed locally with a layer thickness in the range of between 2 and 50 μm.

19. A process as set forth in claim 1, wherein the first layer is applied over the full surface area to the replication layer or the carrier layer in a thickness at which the first layer is opaque to the human eye, and involves an optical density in the range of greater than 1.5.

20. A process as set forth in claim 19, wherein the first layer is applied in a thickness at which the first layer involves an optical density in the range of between 2 and 7.

21. A process as set forth in claim 1, wherein the at least one partially shaped functional layer and the at least one further partially shaped layer are such that viewed perpendicularly to the plane of the replication layer or the carrier layer they supplement each other to afford a decorative and/or informative geometrical, alphanumeric, pictorial, graphic or figurative representation, comprising at least two lines including different functional layer material.

22. A process as set forth in claim 1, wherein the at least one partially shaped functional layer and the at least one further partially shaped layer are respectively provided at least region-wise in line form, wherein the lines merge into each other without lateral displacement and/or form a concentric circular line pattern.

23. A process as set forth in claim 22, wherein the lines are adapted to merge into each other with a continuous color configuration.

24. A process as set forth in claim 22, wherein the lines viewed perpendicularly to the plane of the replication layer or carrier layer are produced with a width in the range of between 0.5 and 50 μm.

25. A process as set forth in claim 1, wherein the at least one partially shaped functional layer is colored with at least one opaque and/or at least one transparent coloring agent which at least in a wavelength range of the electromagnetic spectrum is brightly multi-colored or brightly multi-color-producing, and a coloring agent is contained in the at least one partially shaped functional layer, which can be excited outside the visible spectrum and produces a visually discernible colored impression.

26. A process as set forth in claim 25, wherein the at least one partially shaped functional layer and the at least one further partially shaped layer are produced in complementary colors.

27. A process as set forth in claim 25, wherein the at least one coloring agent is selected from the group of pigments or dyestuffs.

28. A process as set forth in claim 1, wherein the replication layer is arranged on a carrier layer.

29. A process as set forth in claim 1, wherein the carrier layer is adapted to be detachable from the multi-layer body formed.

30. A multi-layer body as set forth in claim 1, wherein the at least one partially shaped functional layer and/or the at least one further partially shaped layer is backed with a diffractive relief structure and presents a holographic or kinegraphic optically variable effect.

31. A multi-layer body comprising at least one partially shaped functional layer in register relationship with at least one further partially shaped layer, wherein a first layer in the form of a first photoresist lacquer layer is produced structured in pattern form on a carrier layer and using the structured first layer as a mask layer the at least one partially shaped functional layer and/or the at least one further partially shaped layer is formed.

32. A multi-layer body as set forth in claim 31, wherein the at least one partially shaped functional layer and the at least one further partially shaped layer supplement each other to provide a decorative and/or informative geometrical, alphanumeric, pictorial, graphic or figurative colored representation.

33. A multi-layer body as set forth in claim 31, wherein at least the at least one partially shaped functional layer and/or at least the at least one further partially shaped layer is in the form of at least one line of a line width in the range of between 0.5 and 10 μm, and/or is in the form of at least one pixel with a pixel diameter in the range of between 0.5 and 10 μm.

34. A multi-layer body as set forth in claim 31, wherein the at least one partially shaped functional layer is an in particular opaque metal layer and the at least one further partially shaped layer is a colored lacquer layer or vice-versa.

35. A multi-layer body as set forth in claim 31, wherein the at least one partially shaped functional layer is a layer containing liquid crystals and the at least one further partially shaped layer is a colored lacquer layer or vice-versa.

36. A multi-layer body as set forth in claim 31, wherein the at least one partially shaped functional layer is formed by a thin film reflection layer stack with a viewing angle-dependent interference color effect and the at least one further partially shaped layer is a colored lacquer layer or vice-versa.

37. A multi-layer body as set forth in claim 31, wherein the at least one partially shaped functional layer is a first colored lacquer layer and the at least one further partially shaped layer is a further differently colored lacquer layer.

38. A multi-layer body as set forth in claim 31, wherein the at least one partially shaped functional layer is a first colored lacquer layer and the at least one further partially shaped layer is a dielectric reflection layer.

39. A multi-layer body as set forth in claim 34, wherein the lacquer layer is colored with at least one opaque and/or at least one transparent substance.

40. A multi-layer body as set forth in claim 34, wherein the colored lacquer layer is colored with at least one coloring agent of the color yellow, magenta, cyan or black (CMYK) or the color red, green or blue (RGB) and/or at least one partially shaped functional layer is provided with at least one red-, green- and/or blue-fluorescing radiation-excitable pigment or dyestuff and thereby produces an additive color upon irradiation.

41. A multi-layer body as set forth in claim 31, wherein the at least one partially shaped functional layer and the at least one further partially shaped layer are produced in complementary colors, at least at a given viewing angle or under a given kind of radiation.

42. A multi-layer body as set forth in claim 31, wherein the at least one partially shaped functional layer and the at least one further partially shaped layer are respectively of line form in such a way that the lines merge into each other without lateral displacement.

43. A multi-layer body as set forth in claim 41, wherein the lines merge into each other with a continuous color configuration.

44. A multi-layer body as set forth in claim 31, wherein the at least one partially shaped functional layer and/or the at least one further partially shaped layer at least region-wise forms/form a raster image made up of pixels, image points or lines which cannot be individually resolved by the human eye.

45. A multi-layer body as set forth in claim 31, wherein there are at least two further partially shaped layers.

46. A multi-layer body as set forth in claim 31, wherein a first transparent spacer layer is provided between the at least one partially shaped functional layer and the at least one further partially shaped layer.

47. A multi-layer body as set forth in claim 31, wherein a second transparent spacer layer is provided between at least two further partially shaped layers.

48. A multi-layer body as set forth in claim 46, wherein the at least one partially shaped functional layer and the at least one further partially shaped layer are such that there is at least one optical superpositioning effect which is possibly viewing angle-dependent.

49. A multi-layer body as set forth in claim 31, wherein the multi-layer body is in the form of a film element.

50. A multi-layer body as set forth in claim 49, wherein the film element has an adhesive layer on at least one side.

51. A security element for security or value-bearing documents, having a multi-layer body as set forth in claim 31.

52. A security element as set forth in claim 51, wherein the security or value-bearing document is a pass, passport, a bank card, an identity card, a bank note, a security bond, a ticket or a security packaging.

53. An electronic component having a multi-layer body as set forth in claim 31.

54. A process for the production of a multi-layer body having at least one partially shaped functional layer in register relationship with at least one further partially shaped layer, the process comprising the steps of:

providing a first photoresist lacquer layer on a carrier layer;

partially exposing the first photoresist lacquer layer with radiation to form exposed regions of the first photoresist lacquer layer and unexposed regions of the first photoresist lacquer layer;

removing one of the exposed regions or the unexposed regions of the first photoresist lacquer layer from the carrier layer to form a structured first photoresist lacquer layer;

providing a second photoresist lacquer layer on the carrier layer;

using the structured first photoresist lacquer layer as a mask layer to partially expose the second photoresist lacquer layer with radiation to form exposed regions of the second photoresist lacquer layer and unexposed regions of the second photoresist lacquer layer; and removing one of the exposed regions or the unexposed regions of the second photoresist lacquer layer from the carrier layer to form a structured second photoresist lacquer layer in register relationship with the structured first photoresist lacquer layer.

* * * * *

UNITED STATES PATENT AND TRADEMARK OFFICE

CERTIFICATE OF CORRECTION

PATENT NO. : 8,367,277 B2
APPLICATION NO. : 12/310035
DATED : February 5, 2013
INVENTOR(S) : Brehm et al.

It is certified that error appears in the above-identified patent and that said Letters Patent is hereby corrected as shown below:

IN THE SPECIFICATION:

Column 34, line 17, now reads "multilayer body loot"

should read -- multilayer body 100′ --

Signed and Sealed this
Sixth Day of August, 2013

Teresa Stanek Rea
*Acting Director of the United States Patent and Trademark Office*

UNITED STATES PATENT AND TRADEMARK OFFICE

CERTIFICATE OF CORRECTION

PATENT NO. : 8,367,277 B2
APPLICATION NO. : 12/310035
DATED : February 5, 2013
INVENTOR(S) : Brehm et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 756 days.

Signed and Sealed this
First Day of September, 2015

Michelle K. Lee
*Director of the United States Patent and Trademark Office*